(12) United States Patent
Chen et al.

(10) Patent No.: US 10,418,459 B2
(45) Date of Patent: Sep. 17, 2019

(54) HIGH ELECTRON MOBILITY TRANSISTOR INCLUDING SURFACE PLASMA TREATMENT REGION

(71) Applicant: Wavetek Microelectronics Corporation, Hsinchu County (TW)

(72) Inventors: Chih-Yen Chen, Tainan (TW); Hsien-Lung Yang, Taipei (TW)

(73) Assignee: Wavetek Microelectronics Corporation, Hsinchu County (TW)

( * ) Notice: Subject to any disclaimer, the term of this patent is extended or adjusted under 35 U.S.C. 154(b) by 0 days.

(21) Appl. No.: 15/803,857

(22) Filed: Nov. 6, 2017

(65) Prior Publication Data

US 2018/0294341 A1 Oct. 11, 2018

(30) Foreign Application Priority Data

Apr. 10, 2017 (TW) .................................. 106111881

(51) Int. Cl.
*H01L 29/66* (2006.01)
*H01L 29/10* (2006.01)
(Continued)

(52) U.S. Cl.
CPC .... *H01L 29/66462* (2013.01); *H01L 29/1045* (2013.01); *H01L 29/1054* (2013.01);
(Continued)

(58) Field of Classification Search
CPC ........... H01L 29/66462; H01L 29/1054; H01L 29/7786; H01L 29/1045; H01L 29/42376
See application file for complete search history.

(56) References Cited

U.S. PATENT DOCUMENTS 7,019,336 B2 * 3/2006 Yamashita ........ H01L 29/42316
257/104
7,638,818 B2 * 12/2009 Wu ....................... H01L 29/207
257/192
(Continued)

OTHER PUBLICATIONS

Liu et al, "Thermally Stable Enhancement-Mode GaN Metal-Isolator-Semiconductor High-Electron-Mobility Transistor with Partially Recessed Fluorine-Implanted Barrier", IEEE Electron Device Letters, vol. 36, No. 4, Apr. 2015.*
(Continued)

*Primary Examiner* — Allen L Parker
*Assistant Examiner* — Charles N Ausar-El
(74) *Attorney, Agent, or Firm* — Winston Hsu

(57) ABSTRACT

A high electron mobility transistor includes a III-V compound layer, a nitride layer, a source electrode, a drain electrode, a gate electrode, a surface plasma treatment region, and at least one moat. The nitride layer is disposed on the III-V compound layer. The source and the drain electrodes are disposed above the III-V compound layer. The gate electrode is disposed above the nitride layer. The moat is at least partially disposed in the nitride layer and between the source and the drain electrodes. The surface plasma treatment region is at least partially disposed in the nitride layer. The surface plasma treatment region is at least partially disposed at a top surface of the nitride layer between the moat and the drain electrode, a top surface of the nitride layer between the moat and the source electrode, and/or a top surface of the nitride layer under the moat.

13 Claims, 26 Drawing Sheets

(51) Int. Cl.
*H01L 29/778* (2006.01)
*H01L 29/423* (2006.01)
*H01L 29/51* (2006.01)
*H01L 29/20* (2006.01)
*H01L 29/207* (2006.01)

(52) U.S. Cl.
CPC .... *H01L 29/42376* (2013.01); *H01L 29/7786* (2013.01); *H01L 29/2003* (2013.01); *H01L 29/207* (2013.01); *H01L 29/4236* (2013.01); *H01L 29/513* (2013.01)

(56) References Cited

U.S. PATENT DOCUMENTS

| | | | | |
|---|---|---|---|---|
| 7,692,263 B2* | 4/2010 | Wu | H01L 29/2003 | 257/367 |
| 7,932,539 B2* | 4/2011 | Chen | H01L 29/7787 | 257/183 |
| 7,955,918 B2 | 6/2011 | Wu | | |
| 7,972,915 B2* | 7/2011 | Chen | H01L 21/8252 | 257/192 |
| 8,044,432 B2* | 10/2011 | Chen | H01L 29/2003 | 257/183 |
| 8,076,699 B2* | 12/2011 | Chen | H01L 27/0605 | 257/194 |
| 8,124,505 B1* | 2/2012 | Burnham | H01L 29/66462 | 257/E21.407 |
| 8,283,699 B2* | 10/2012 | Wu | H01L 29/402 | 257/183 |
| 8,502,323 B2* | 8/2013 | Chen | H01L 29/7786 | 257/392 |
| 8,624,296 B1* | 1/2014 | Wong | H01L 29/66462 | 257/194 |
| 8,633,094 B2* | 1/2014 | Ramdani | H01L 21/28264 | 257/192 |
| 8,633,494 B2* | 1/2014 | Nishimori | H01L 29/42316 | 257/76 |
| 8,669,589 B2* | 3/2014 | Wu | H01L 29/207 | 257/192 |
| 8,846,479 B2* | 9/2014 | Kanamura | H01L 29/205 | 257/411 |
| 8,912,571 B2* | 12/2014 | Kanamura | H01L 29/66462 | 257/194 |
| 9,111,905 B2* | 8/2015 | Yao | H01L 29/41725 | |
| 9,337,279 B2* | 5/2016 | Ostermaier | H01L 29/0649 | |
| 9,385,224 B2* | 7/2016 | Renaldo | H01L 29/7783 | |
| 9,515,162 B2* | 12/2016 | Reiner | H01L 29/66462 | |
| 9,960,264 B1* | 5/2018 | Chen | H01L 29/7786 | |
| 2006/0049427 A1* | 3/2006 | Takahashi | H01L 27/0605 | 257/194 |
| 2006/0208279 A1* | 9/2006 | Robinson | H01L 29/66462 | 257/194 |
| 2006/0255377 A1* | 11/2006 | Tu | H01L 29/402 | 257/280 |
| 2007/0126055 A1* | 6/2007 | Hueting | H01L 29/402 | 257/330 |
| 2012/0146046 A1* | 6/2012 | Ohki | H01L 29/4236 | 257/76 |
| 2013/0105808 A1* | 5/2013 | Wong | H01L 29/517 | 257/76 |
| 2015/0014696 A1* | 1/2015 | Chen | H01L 29/205 | 257/76 |
| 2016/0260817 A1* | 9/2016 | Reiner | H01L 29/66462 | |
| 2017/0125407 A1* | 5/2017 | Schulze | H01L 21/823418 | |
| 2018/0286960 A1* | 10/2018 | Huo | H01L 29/4236 | |
| 2018/0294335 A1* | 10/2018 | Luo | H01L 29/158 | |

OTHER PUBLICATIONS

Yuhao Zhang, S.B. Physics, Peking University, 2011, "Simulation and Fabrication of GaN-Based Vertical and Lateral Normally-off Power Transistors", M.S.E.E./M.S.C.S. thesis, Massachusetts Intstitute of Technology, Jun. 2013, All Rights Reserved. (Year: 2013).*

Song, "Normally Off AlGaN/GaN Low-Density Drain HEMT (LDD-HEMT) With Enhanced Breakdown Voltage and Reduced Current Collapse", IEEE Electron Device Letters, vol. 28, Issue: 3, Mar. 2007.

Wang, "6.5 V High Threshold Voltage AlGaN/GaN Power Metal-Insulator-Semiconductor High Electron Mobility Transistor Using Multilayer Fluorinated Gate Stack", IEEE Electron Device Letters, vol. 36, Issue: 4, Apr. 2015.

* cited by examiner

HIGH ELECTRON MOBILITY TRANSISTOR INCLUDING SURFACE PLASMA TREATMENT REGION

BACKGROUND OF THE INVENTION

1. Field of the Invention

The present invention relates to a high electron mobility transistor (HEMT), and more particularly, to an HEMT including a moat and a surface plasma treatment region.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. However, the electrical performance of the HEMT will be influenced by the condition of the interface between the GaN based material layers and the defect conduction between the gate dielectric layer and the GaN based material layer. For example, reliability problems such as stability of threshold voltage (Vth) and hysteresis of the threshold voltage may be generated, and the required enhancement mode (E-mode) operation will be hindered by the condition of depletion mode (D-mode) channel formed at the surface. Therefore, it is an important issue for the related field to solve the above-mentioned problems and improve the electrical performance and the reliability by modifying the structural design and/or the process design.

SUMMARY OF THE INVENTION

It is one of the objectives of the present invention to provide a high electron mobility transistor (HEMT). A surface plasma treatment region is formed at a top surface of a nitride layer for mitigating the condition of forming surface channel on the top surface of the nitride layer. Reliability problems such as stability of threshold voltage and hysteresis of the threshold voltage may be improved, and the electrical performance and the reliability of the HEMT may be enhanced accordingly.

A high electron mobility transistor is provided in an embodiment of the present invention. The high electron mobility transistor includes a III-V compound layer, a nitride layer, a source electrode, a drain electrode, a gate electrode, a surface plasma treatment region, and at least one moat. The nitride layer is disposed on the III-V compound layer. The source electrode and the drain electrode are disposed above the III-V compound layer. The gate electrode is disposed over the nitride layer located between the source electrode and the drain electrode. The moat is at least partially disposed in the nitride layer and at least partially disposed between the source electrode and the drain electrode. The surface plasma treatment region is at least partially disposed in the nitride layer. The surface plasma treatment region is at least partially disposed at a top surface of the nitride layer disposed between the at least one moat and the drain electrode, at a top surface of the nitride layer disposed between the at least one moat and the source electrode, and/or at a top surface of the nitride layer under the at least one moat.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
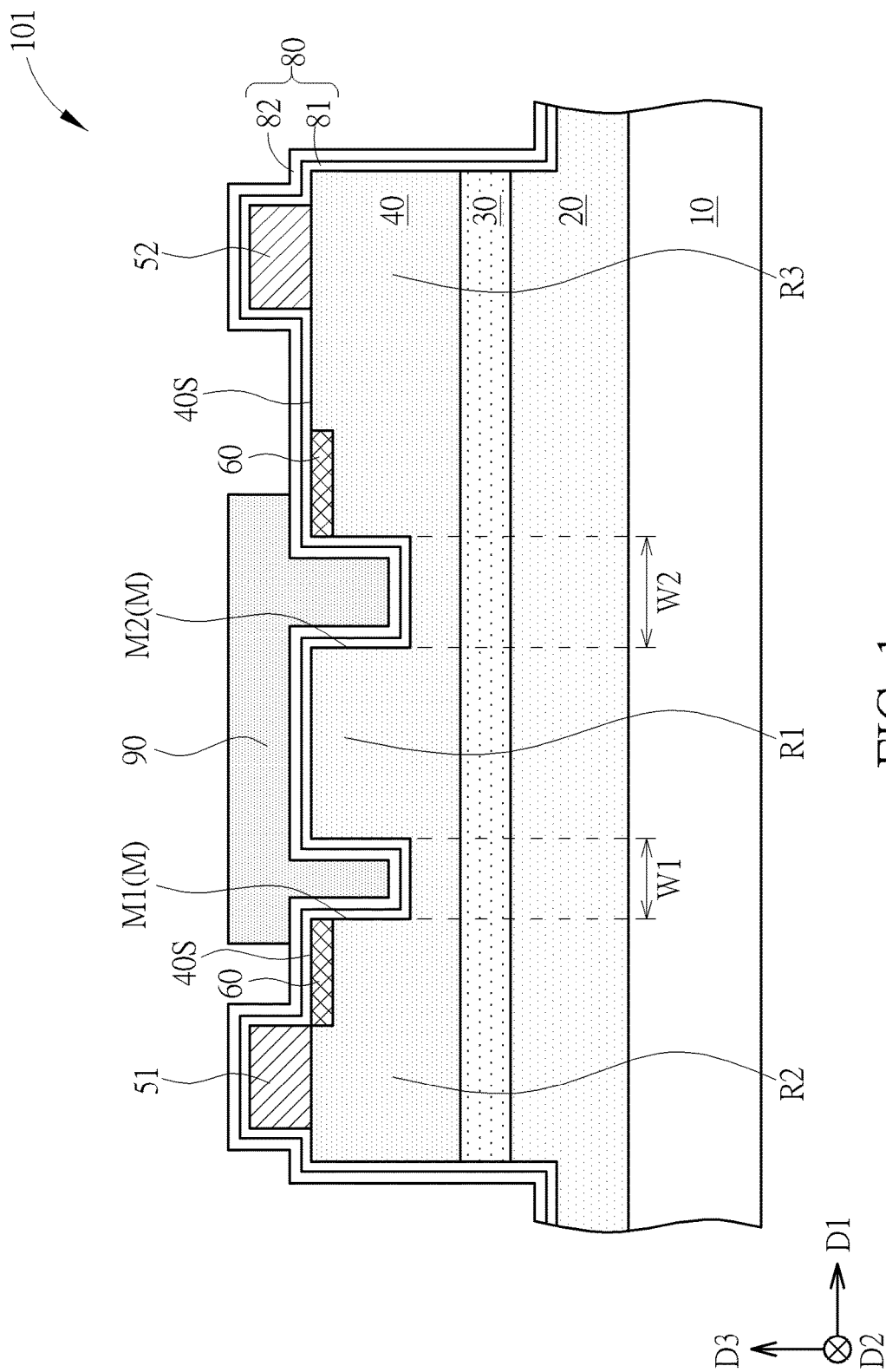
FIG. 1 is a schematic drawing illustrating a high electron mobility transistor (HEMT) according to a first embodiment of the present invention.

Please refer to FIG. 1. FIG. 1 is a schematic drawing illustrating a high electron mobility transistor (HEMT) according to a first embodiment of the present invention. As shown in FIG. 1, an HEMT 101 is provided in this embodiment. The HEMT 100 includes a III-V compound layer 30, a nitride layer 40, a source electrode 51, a drain electrode 52, a gate electrode 90, a surface plasma treatment region 60, and at least one moat M. The nitride layer 40 is disposed on the III-V compound layer 30. In some embodiments, the III-V compound layer 30 may be used as a channel layer in the HEMT 101 and may be formed by materials such as gallium nitride (GaN) and/or indium gallium nitride (InGaN), but not limited thereto. Additionally, in some embodiments, the nitride layer 40 may be used as a barrier layer or a capping layer in the HEMT 101, the nitride layer 40 may be formed by materials such as aluminum gallium nitride (AlGaN), aluminum indium nitride (AlInN), and/or aluminum nitride (AlN) when the nitride layer 40 is used as a barrier layer, and the nitride layer 40 may be formed by materials such as aluminum gallium nitride, aluminum nitride, gallium nitride, and/or silicon nitride when the nitride layer 40 is used as a capping layer, but not limited thereto. In other words, the composition of the III-V compound layer 30 may be different from the composition of the nitride layer 40 when the nitride layer 40 is used as a barrier layer, and the composition of the III-V compound layer 30 may be the same as or different from the composition of the nitride layer 40 when the nitride layer 40 is used as a capping layer.

The source electrode 51 and the drain electrode 52 are disposed above the III-V compound layer 30. The gate electrode 90 is disposed over the nitride layer 40 located between the source electrode 51 and the drain electrode 52. In some embodiments, the source electrode 51 and the drain electrode 52 may be disposed above the nitride layer 40, but not limited thereto. In some embodiments, the source electrode 51 and the drain electrode 52 may also be disposed above the III-V compound layer 30 without being disposed above the nitride layer 40 according to other considerations. In addition, the source electrode 51 and the drain electrode 52 may be disposed at two opposite sides of the gate electrode 90 in a first direction D1 respectively, but not limited thereto. The source electrode 51, the drain electrode 52, and the gate electrode 90 may include conductive metal materials or other suitable conductive materials respectively. The conductive metal materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stack layer of the above-mentioned materials, or an alloy of the above-mentioned materials, but not limited thereto. In some embodiments, the HEMT 101 may further include a gate dielectric layer 80 disposed on the nitride layer 40, a part of the gate dielectric layer 80 may be disposed between the nitride layer 40 and the gate electrode 90 in a vertical direction D3, and the gate dielectric layer 80 may extend to cover the source electrode 51, the drain electrode 51, a side surface of the III-V compound layer 30, and a side surface of the nitride layer 40, but not limited thereto. In some embodiments, the gate dielectric layer 80 may be a single layer structure or a structure of stacked multiple material layers. For example, the gate dielectric layer 80 may include a first dielectric layer 81 and a second dielectric layer 82, but not limited thereto. The material of the gate dielectric layer 80 may include aluminum nitride, silicon nitride (such as $Si_3N_4$), silicon oxide (such as $SiO_2$), aluminum oxide (such as $Al_2O_3$), hafnium oxide (such as $HfO_2$), lanthanum oxide (such as $La_2O_3$), lutetium oxide (such as $Lu_2O_3$), lanthanum lutetium oxide (such as $LaLuO_3$), or other appropriate dielectric materials.

The moat M is at least partially disposed in the nitride layer 40 and at least partially disposed between the source electrode 51 and the drain electrode 52. The surface plasma treatment region 60 is at least partially disposed in the nitride layer 40. The surface plasma treatment region 60 is at least partially disposed at a top surface 40S of the nitride layer 40 disposed between the at least one moat M and the drain electrode 52, at a top surface of the nitride layer 40 disposed between the at least one moat M and the source electrode 51, and/or at a top surface of the nitride layer 40 under the at least one moat M. For example, in some embodiments, the moat M may include a first moat M1 and a second moat M2, and the nitride layer 40 may include a first region R1, a second region R2, and a third region R3. The first region R1 is disposed under the gate electrode 90, the second region R2 is disposed under the source electrode 51, and the third region R3 is disposed under the drain electrode 52. The first moat M1 and the second moat M2 are at least partially disposed in the nitride layer 40. The first moat M1 may be at least partially disposed between the first region R1 of the nitride layer 40 and the source electrode 51 in the first direction D1, and the second moat M2 may be at least partially disposed between the first region R1 of the nitride layer 40 and the drain electrode 52 in the first direction D1. The first moat M1 may be at least partially disposed between the first region R1 of the nitride layer 40 and the second region R2 of the nitride layer 40 in the first direction D1, and the second moat M2 may be at least partially disposed between the first region R1 of the nitride layer 40 and the third region R3 of the nitride layer 40 in the first direction D1 when the source electrode 51 and the drain electrode 52 are disposed above the nitride layer 40. In other words, the first moat M1 is located at a side adjacent to the source electrode 51, the second moat is located at a side adjacent to the drain electrode 52, and the first region R1 under the gate electrode 90 may be located between the first moat M1 and the second moat M2 in the first direction D1. The first moat M1 and the second moat M2 may be used to control and/or alter the two-dimensional electron gas (2DEG) and the electric field distribution formed in the HEMT 101, and the electrical performance of the HEMT 101 and/or the reliability of the HEMT 101 may be improved accordingly. For example, the stability of the threshold voltage (Vth) and the hysteresis of the threshold voltage may be improved accordingly, but not limited thereto. Additionally, in some embodiments, the depths of the first moat M1 and the second moat M2 may be controlled for some considerations. For instance, the first moat M1 and the second moat M2 may penetrate the nitride layer 40 respectively (not shown in FIG. 1). In some embodiments, the first moat M1 and the second moat M2 may not penetrate the nitride layer 40 for avoiding generating damage to the channel region by the etching process of forming the first moat M1 and the second moat M2 and reducing the charge trapping effect in the area under the gate electrode, and the reliability of the HEMT 101 may be further improved accordingly.

As shown in FIG. 1, the HEMT 101 may further include a buffer layer 20 disposed under the III-V compound layer 30, and the HEMT 101 may be disposed on a substrate 10, but not limited thereto. In some embodiments, the buffer layer 20 may include gallium nitride, aluminum gallium nitride, or other suitable buffer materials. The substrate 10 may include silicon substrate, silicon carbide substrate, gallium nitride substrate, sapphire substrate, or substrate formed by other appropriate materials. Additionally, the electric field distribution may be modified by controlling the dimension of the gate electrode 90, the distance between the gate electrode 90 and the source electrode 51, the distance between the gate electrode 90 and the drain electrode 52, and/or the dimensions of the first moat M1 and the second moat M2 for enhancing the breakdown voltage of the HEMT 101. For example, a length of the first moat M1 in the first direction D1 (such as a first length W1 shown in FIG. 1) may be shorter than a length of the second moat M2 in the first direction D1 (such as a second length W2 shown in FIG. 1), but not limited thereto. In some embodiments of the present invention, the first length W1 of the first moat M1 may also be longer than or equal to the second length W2 of the second moat M2 according to other considerations. Additionally, in some embodiments, the gate electrode 90 may extend for being partially disposed in the first moat M1 and/or the second moat M2. The gate electrode 90 may extend towards the source electrode 51 and overlap a part of the nitride layer 40 disposed between the first moat M1 and the source electrode 51 in the vertical direction D3. The gate electrode 90 may also extend towards the drain electrode 52 and overlap a part of the nitride layer 40 disposed between the second moat M2 and the drain electrode 52 in the vertical direction D3. In some embodiments, the first moat M1 and/or the second moat M2 may be filled with the gate dielectric layer 80 and the gate electrode 90, but not limited thereto.

In some embodiments, at least a part of the surface plasma treatment region 60 may be disposed in the nitride layer 40 located between the first moat M1 and the source electrode 51, and at least a part of the surface plasma treatment region 60 may be disposed in the nitride layer 40 located between the second moat M2 and the drain electrode 52. In other words, the surface plasma treatment region 60 may be at least partially disposed at the top surface 40S of the nitride layer 40 disposed between the first moat M1 and the source electrode 51 and/or at least partially disposed at the top surface 40S of the nitride layer 40 disposed between the second moat M2 and the drain electrode 52. The surface plasma treatment region 60 may be formed on at least a part of the top surface 40S of the nitride layer 40, ions in the surface plasma treatment region 60, such as negative fluorine ions ($F^-$), may be used to alter the energy band at the surface of the nitride layer 40 for suppressing the condition of charge trapping in the area adjacent to the top surface 40S of the nitride layer 40 and the formation of surface channel. The current collapse issue which might occur in the HEMT 101 may be improved accordingly, the reliability issues such as stability of threshold voltage and hysteresis of the threshold voltage may be improved also, and the electrical performance and the reliability of the HEMT 101 may be enhanced. Additionally, the ions in the surface plasma treatment region 60 is not limited to the fluorine ions described above, and other appropriate components (such as chlorine ions or other kinds of negative ions) may also be used to form the surface plasma treatment region 60. In some embodiments, the surface plasma treatment region 60 may extend to be partially disposed in the gate dielectric layer 80 above the nitride layer 40, but not limited thereto.

Figure 2:
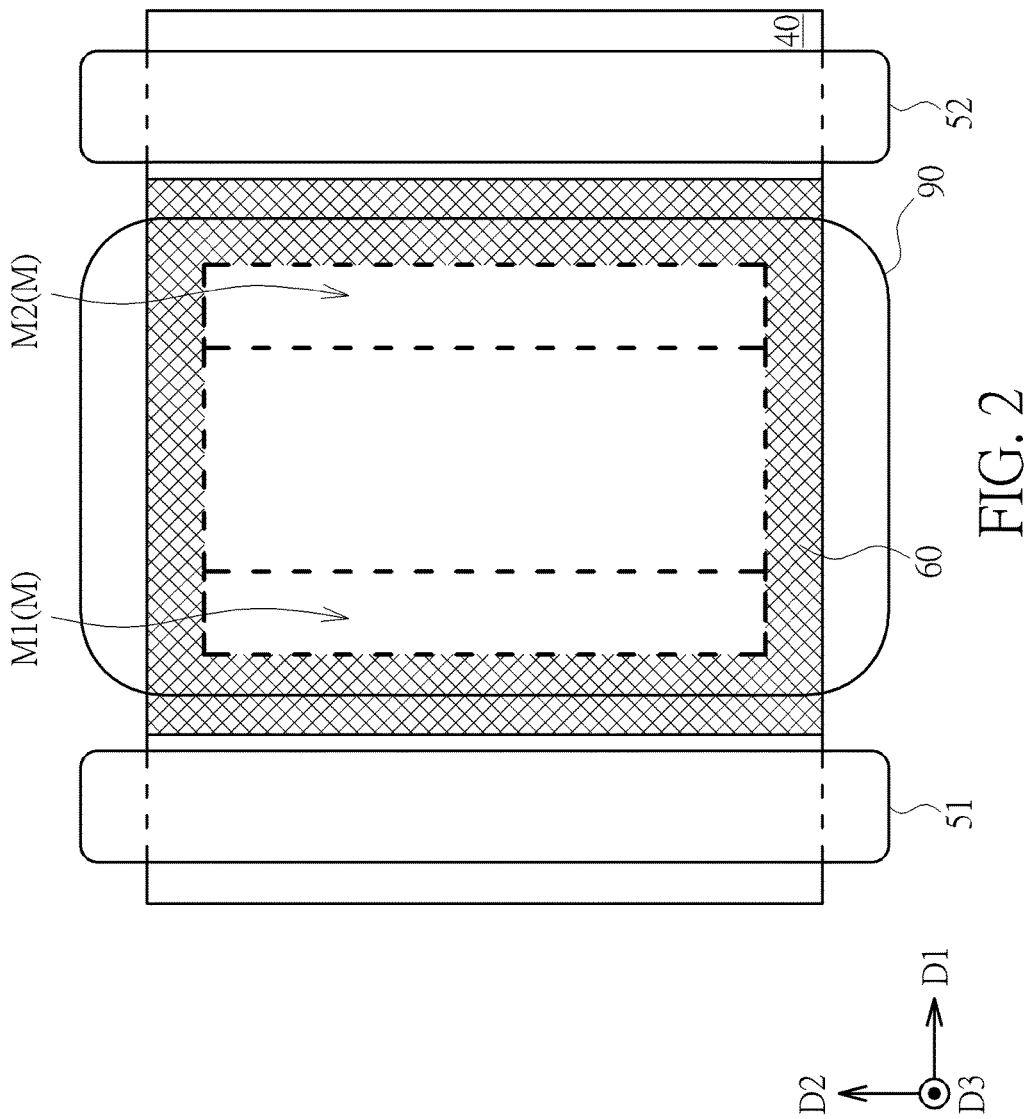
FIG. 2 is a top view schematic drawing illustrating an example of the HEMT according to the first embodiment of the present invention.
Figure 3:
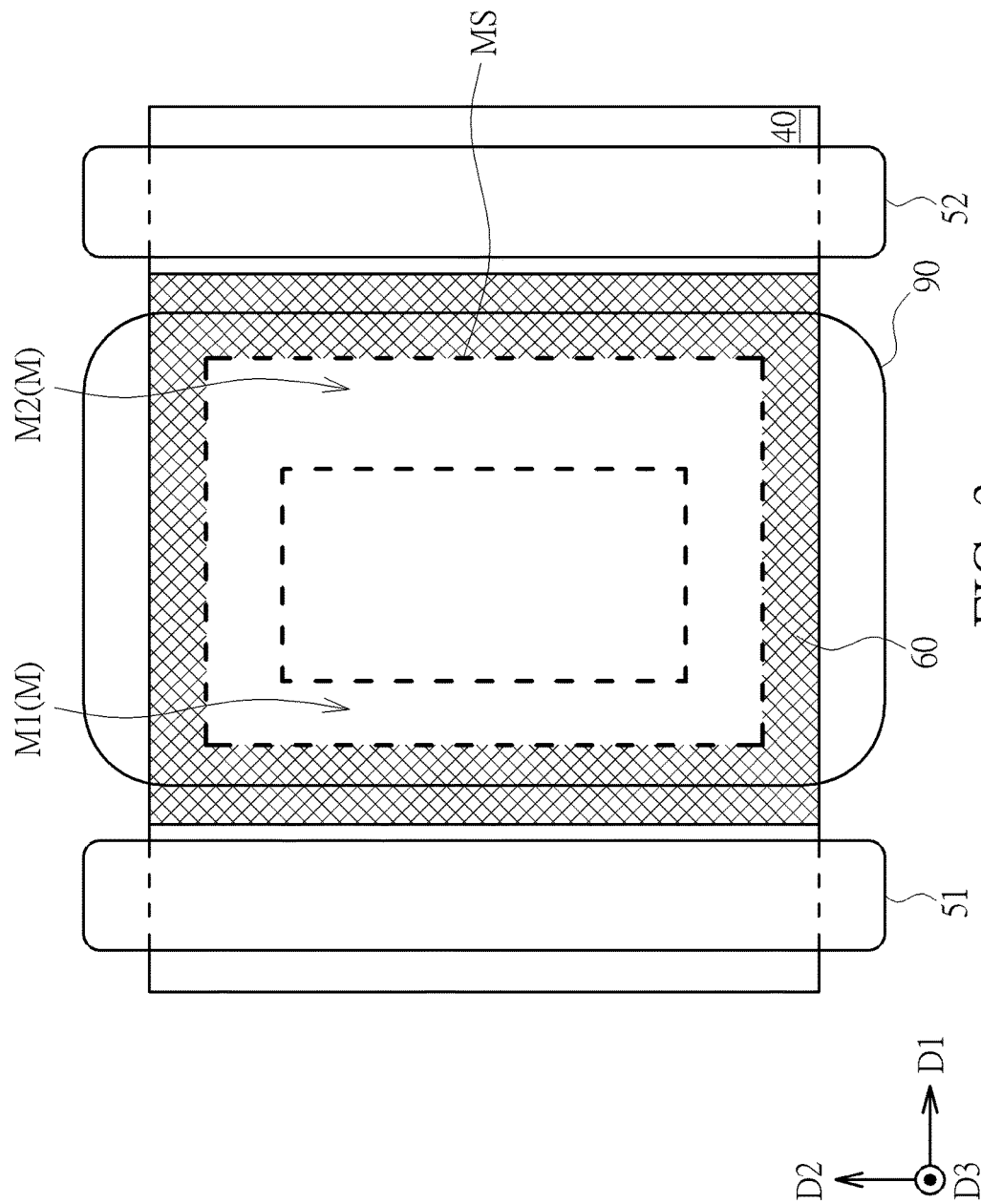
FIG. 3 is a top view schematic drawing illustrating another example of the HEMT according to the first embodiment of the present invention.

Please refer to FIGS. 1-3. FIG. 2 is a top view schematic drawing illustrating an example of the HEMT 101 in this embodiment, and FIG. 3 is a top view schematic drawing illustrating another example of the HEMT 101 in this embodiment. As shown in FIG. 1 and FIG. 2, in some examples, the first moat M1 and the second moat M2 may be separated from each other. For instance, the first moat M1 and the second moat M2 may respectively be a stripe moat extending in a second direction D2 perpendicular to the first direction D1, but not limited thereto. In addition, the surface plasma treatment region 60 may be partially disposed at two ends of the nitride layer 40 in the second direction D2, and the surface plasma treatment region 60 may be a ring shaped region surrounding the first moat M1 and the second moat M2, but not limited thereto. As shown in FIG. 1 and FIG. 3, in some examples, the first moat M1 and the second moat M2 may be connected to each other and form a moat structure MS. The moat structure MS may be a closed moat surrounding a part of the nitride layer 40. In other words, the moat structure MS includes the first moat M1 and the second moat M2 described above, and the moat structure MS surrounds the first region R1 of the nitride layer 40 in the first direction D1 and the second direction D2. Additionally, the surface plasma treatment region 60 may be a ring shaped region surrounding the moat structure MS, but not limited thereto. The 2DEG and the electric field distribution may be further controlled and/or altered by the moat structure MS surrounding the part of the nitride layer 40 under the gate electrode 90, and that will benefit the electrical performance and the reliability of the HEMT 101. Additionally, it is worth noting that the allocation of the first moat M1 and the second moat M2 separated from each other as shown in FIG. 2 and the allocation of the first moat M1 and the second moat M2 connected to each other to be the moat structure MS as shown in FIG. 3 may also be applied to other embodiments of the present inventions.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
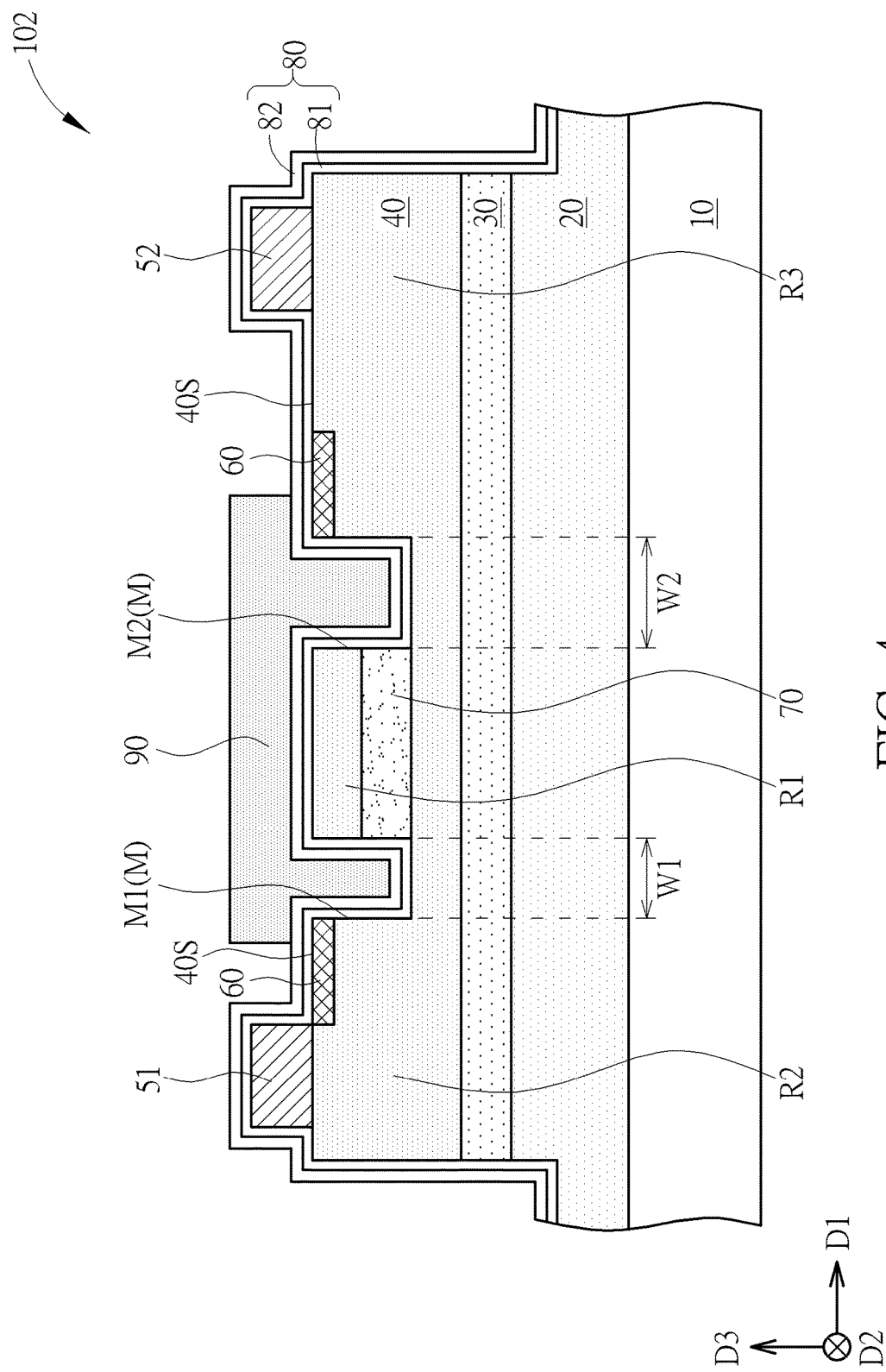
FIG. 4 is a schematic drawing illustrating an HEMT according to a second embodiment of the present invention.

Please refer to FIG. 4. FIG. 4 is a schematic drawing illustrating an HEMT according to a second embodiment of the present invention. As shown in FIG. 4, the difference between an HEMT 102 in this embodiment and the HEMT in the first embodiment mentioned above is that the HEMT 102 may further include a fluorinated region 70 disposed in the nitride layer 40, and the fluorinated region 70 is at least partially disposed in the first region R1 of the nitride layer 40, but not limited thereto. The fluorinated region 70 may include fluorine ions therein, and the fluorine ions may provide static and strong negative charge for effective depleting electrons of the carrier channel. The carrier concentration may become lowered or the channel may be interrupt, the carrier channel may become normally-off, and the HEMT 102 may be a normally-off transistor, but not limited thereto. The dimension and the depth of the fluorinated region 70 may be controlled by modifying the process parameters of the process for forming the fluorinated region 70, such as an ion implantation. For example, the topmost surface of the fluorinated region 70 may be lower than the topmost surface of the nitride layer 40, and the bottommost surface of the fluorinated region 70 may be higher than the bottommost surface of the nitride layer 40, but not limited thereto. In some embodiments, the fluorinated region 70 may contact the topmost surface of the nitride layer 40 and/or the bottommost surface of the nitride layer 40.

In some embodiments, at least a part of the fluorinated region 70 may be disposed between the first moat M1 and the second moat M2 in the first direction D1. The first moat M1 and the second moat M2 may form a physical restriction for reducing migrations of the fluorine ions in the fluorinated region 70 with the driving force of generated heat and/or electrical field especially under long time operation of the HEMT 102. The reliability of the HEMT 102 may be effectively enhanced by the restriction of the migration, and the electrical performance of the HEMT 102 may be improved also because the first moat M1 and the second moat M2 may also be used to control and/or alter the electric field distribution.

Additionally, in some embodiments, the bottom surfaces of the first moat M1 and the second moat M2 may be substantially located at the same level with the bottommost surface of the fluorinated region 70, but not limited thereto. In some embodiments of the present invention, the bottom surfaces of the first moat M1 and the second moat M2 may also be higher than or lower than the bottommost surface of the fluorinated region 70 according to some considerations, and the bottom surfaces of the first moat M1 and the second moat M2 may be even higher than the topmost surface of the fluorinated region 70. Apart from forming the physical restriction to the migration of the fluorinated region 70, the first moat M1 and the second moat M2 may also be used to redistribute and/or reshape the electric field, such as the strong electric field between the gate electrode 90 and the drain electrode 52, for blocking the migration of the fluorinated region 70. The process window of forming the first moat M1 and the second moat M2 may be more flexible because specific effects of suppressing the migration of the fluorinated region 70 and/or controlling the electric field may be formed no matter how deep the first moat M1 and the second moat M2 are. In some embodiments, the fluorinated region 70 may not contact the first moat M1 and/or the second moat M2 directly, but not limited thereto. In some embodiments, the length of the first moat M1 in the first direction D1 (such as the first length W1 shown in FIG. 4) may be shorter than the length of the second moat M2 in the first direction D1 (such as the second length W2 shown in FIG. 4). The bigger second moat M2 may be used to mitigate the electric field distribution between the gate electrode 90 and the drain electrode 52 for keeping the negatively charged fluorine ions in the fluorinated region 60 from migrating outward by the stronger electric field, but not limited thereto. In some embodiments, the second length W2 of the second moat M2 in the first direction D1 may be shorter than or equal to the first length W1 of the first moat M1 in the first direction D1. Additionally, it is worth noting that the ion concentration of the surface plasma treatment region 60 may be relatively lower as compared with the fluorinated region 70 for ensuring the normally-off channel effect generated by the fluorinated region 70. On the other hand, the ion concentration of the fluorinated region 70 may be relatively higher for completely depleting the surface channel within the device operation range and enhancing the device reliability. For instance, when the surface plasma treatment region 60 is a fluorine plasma region, a fluorine concentration of the surface plasma treatment region 60 may be lower than or higher than a fluorine concentration of the fluorinated region 70, but not limited thereto.

As shown in FIG. 4, a manufacturing method of the HEMT 102 in this embodiment may include but is not limited to the following steps. Firstly, the buffer layer 20, the III-V compound layer 30, and the nitride layer 40 are sequentially formed on the substrate 10. A mask layer such as a dielectric capping layer (not shown) may be formed on the nitride layer 40, and an etching process is performed to etch the buffer layer 20, the III-V compound layer 30, and the nitride layer 40 with the dielectric capping layer as a mask for forming a mesa structure. After removing the dielectric capping layer mentioned above, the source electrode 51 and the drain electrode 52 are formed on the nitride layer 40 and the fluorinated region 70 is formed in the nitride layer 40. Subsequently, the first moat M1 and the second moat M2 are formed, and a plasma treatment such as a low power plasma treatment is performed to form the surface plasma treatment region 60. The gate dielectric layer 80 and the gate electrode 90 may be formed after the plasma treatment. It is worth noting that the formation sequence of the moat M, the fluorinated region 70, and the surface plasma treatment region 60 in the present invention is not limited to the condition described above. For example, in some embodiments, the fluorinated region 70 may be formed before the step of forming the first moat M1 and the second moat M2, and the surface plasma treatment region 60 may be formed after the step of forming the first moat M1 and the second moat M2. However, in some embodiments, the first moat M1 and the second moat M2 may be formed before the step of forming the fluorinated region 70 and the step of forming the surface plasma treatment region 60.

Figure 5:
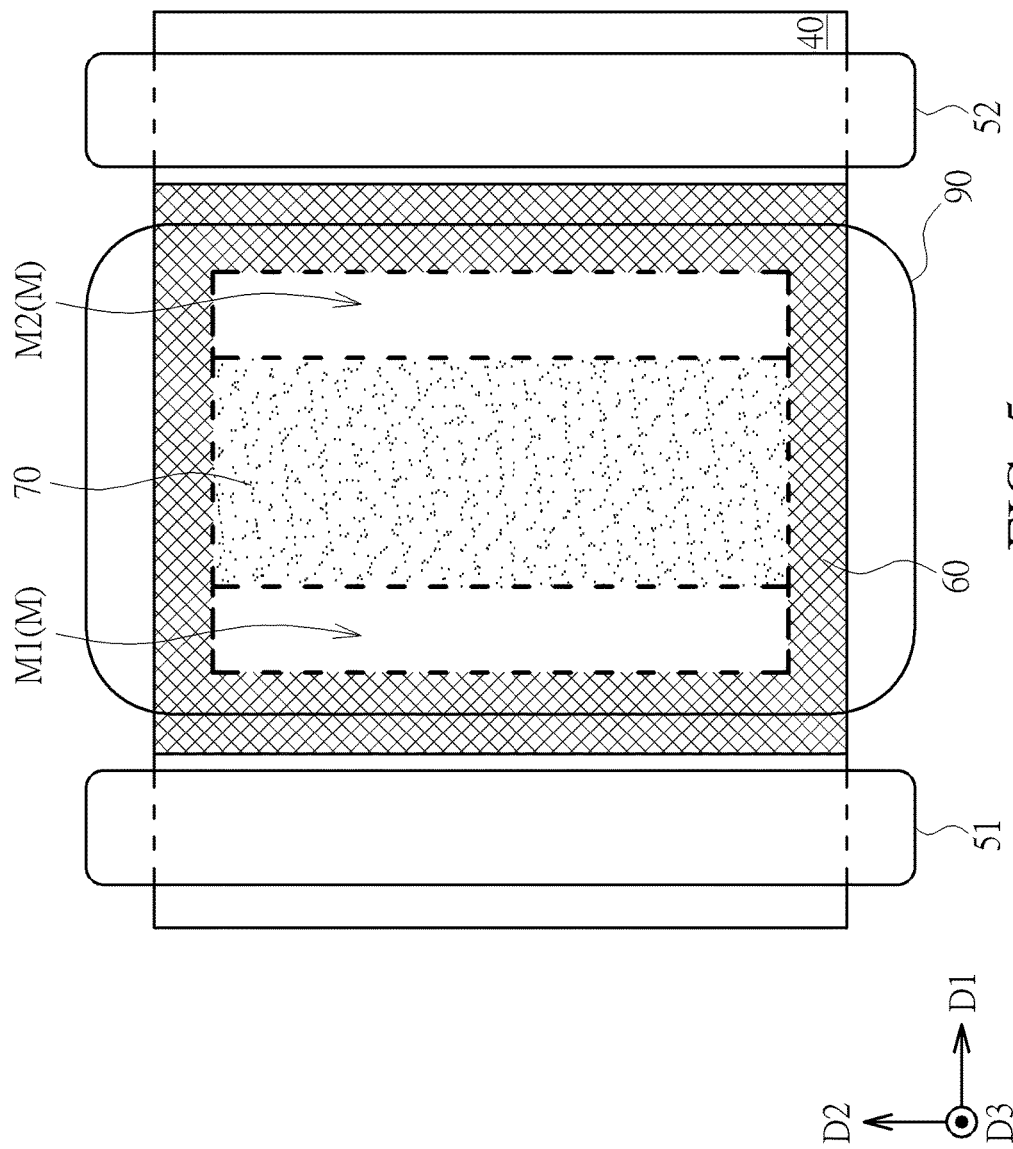
FIG. 5 is a top view schematic drawing illustrating an example of the HEMT according to the second embodiment of the present invention.
Figure 6:
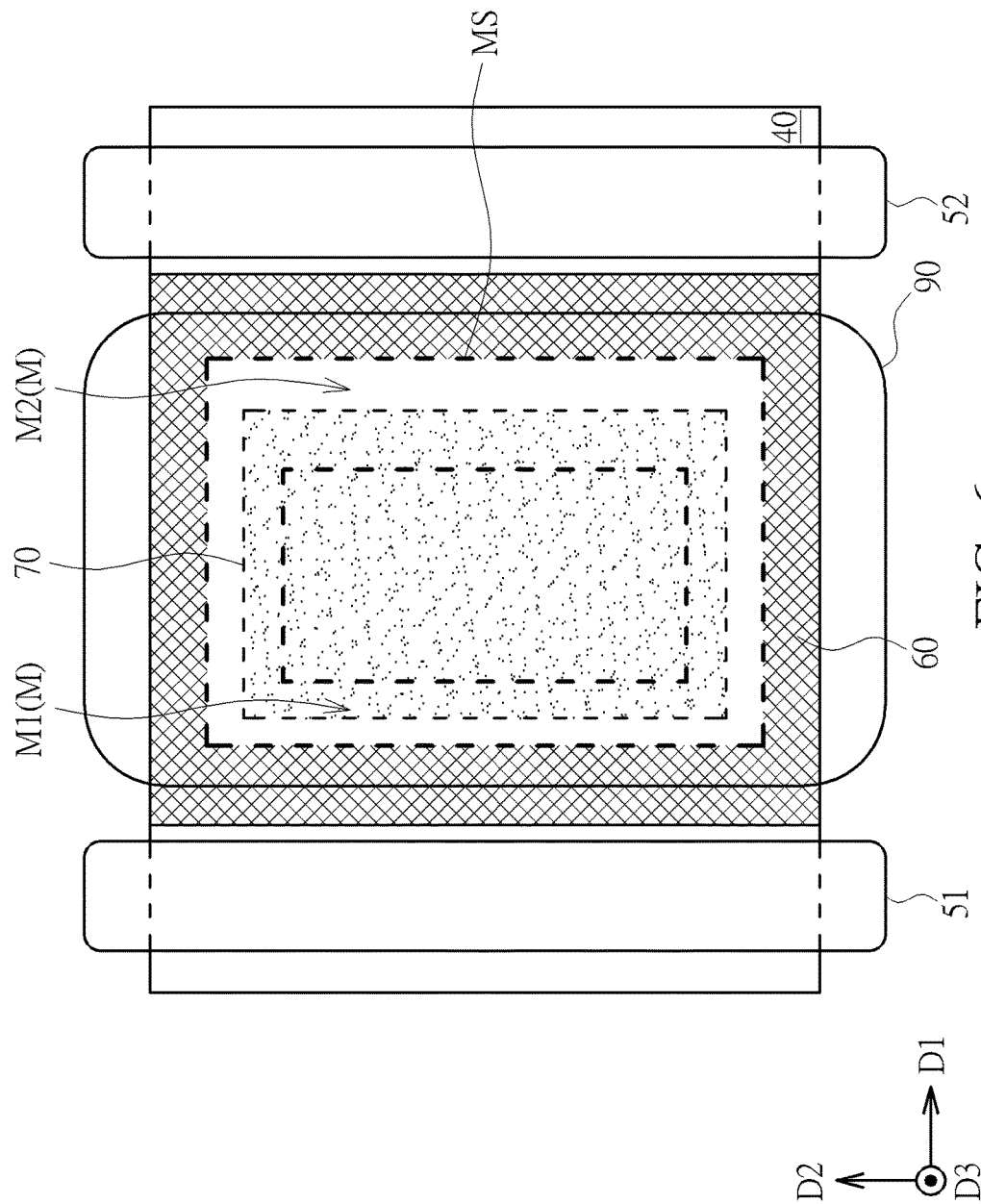
FIG. 6 is a top view schematic drawing illustrating another example of the HEMT according to the second embodiment of the present invention.

Please refer to FIGS. 4-6. FIG. 5 is a top view schematic drawing illustrating an example of the HEMT 102 in this embodiment, and FIG. 6 is a top view schematic drawing illustrating another example of the HEMT 102 in this embodiment. As shown in FIG. 4 and FIG. 5, in some examples, the first moat M1 and the second moat M2 may be separated from each other. For instance, the first moat M1 and the second moat M2 may respectively be a stripe moat extending in the second direction D2, and at least a part of the fluorinated region 70 may be disposed between the first moat M1 and the second moat M2 in the first direction D1, but not limited thereto. As shown in FIG. 4 and FIG. 6, in some examples, the first moat M1 and the second moat M2 may be connected to each other and form the moat structure MS. The moat structure MS may surround the first region R1 of the nitride layer 40 and at least a part of the fluorinated region 70 in the first direction D1 and the second direction D2. The effect of suppressing the migration of the fluorinated region 70 may be further improved because of the formation of the moat structure MS surrounding at least a part of the fluorinated region 70, and the reliability of the HEMT 102 may be further enhanced accordingly.

Figure 7:
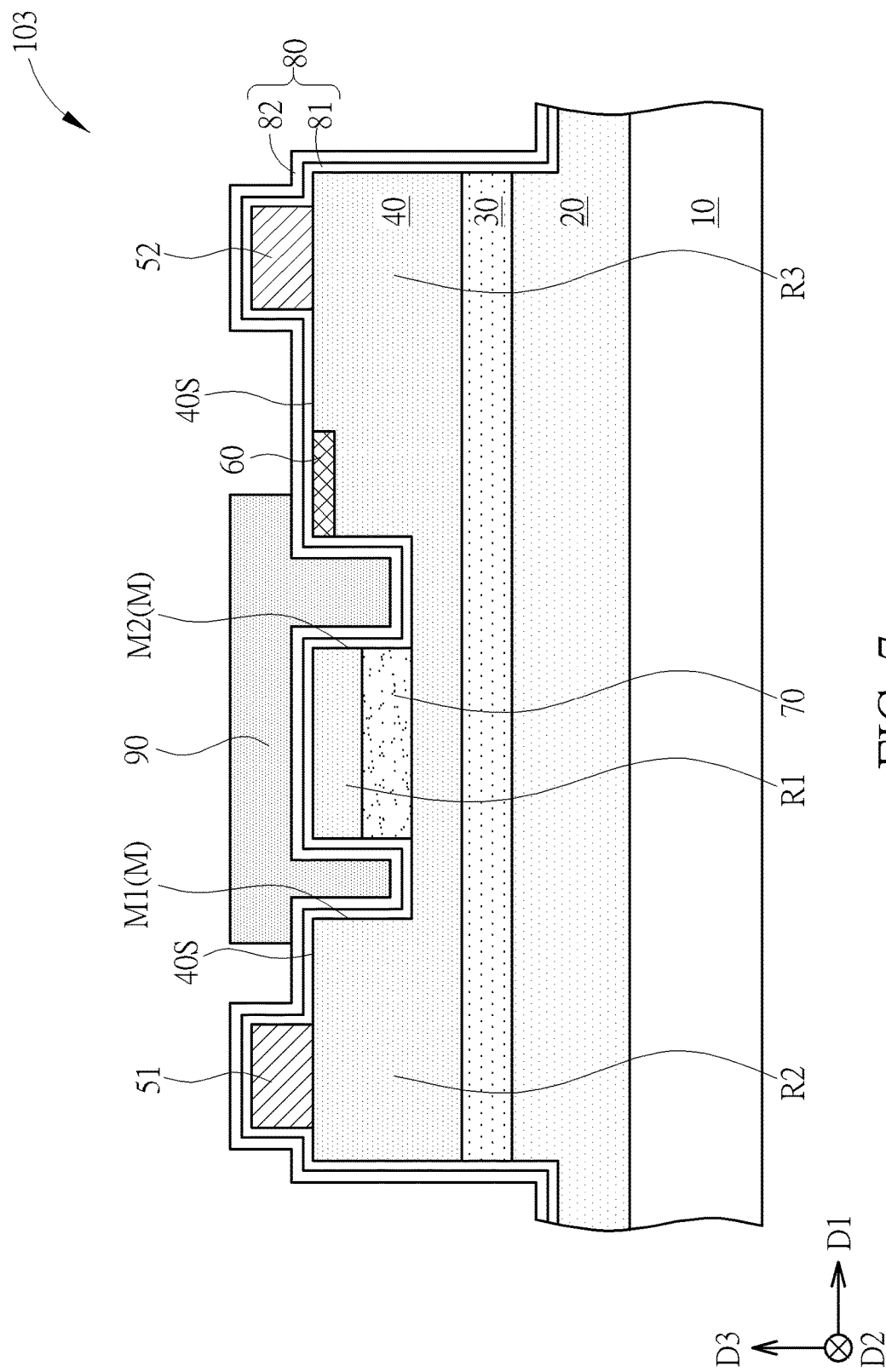
FIG. 7 is a schematic drawing illustrating an HEMT according to a third embodiment of the present invention.
Figure 8:
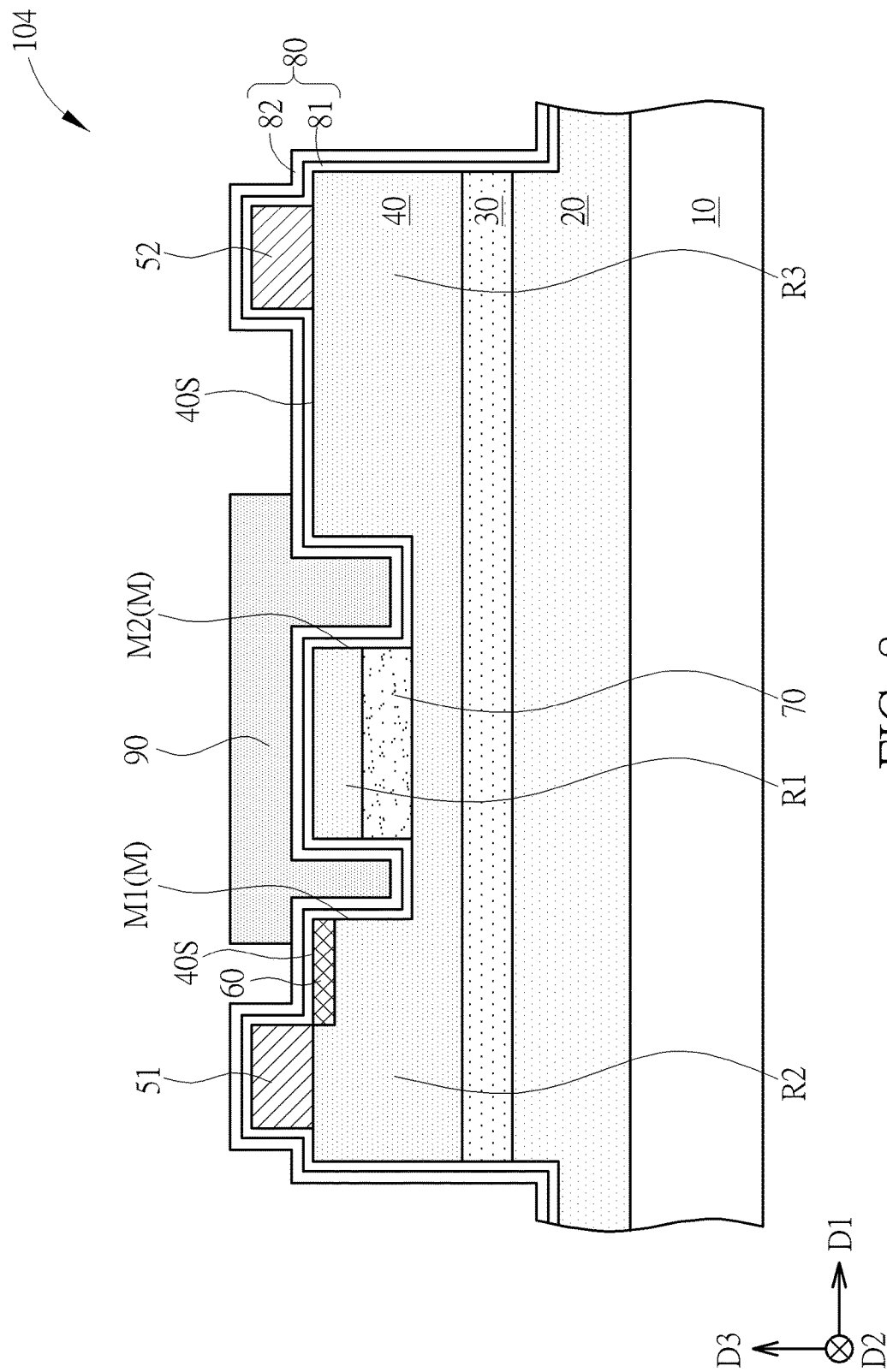
FIG. 8 is a schematic drawing illustrating an HEMT according to a fourth embodiment of the present invention.

Please refer to FIG. 7 and FIG. 8. FIG. 7 is a schematic drawing illustrating an HEMT 103 according to a third embodiment of the present invention, and FIG. 8 is a schematic drawing illustrating an HEMT 104 according to a fourth embodiment of the present invention. In the HEMT of the present invention, the demanded effects of suppressing the current collapse and improving the hysteresis of the threshold voltage may be obtained by modifying the location of the surface plasma treatment region 60. For example, as shown in FIG. 7, in some embodiments, the surface plasma treatment region 60 may be disposed only at a part of the top surface 40S of the nitride layer 40 located between the second moat M2 and the drain electrode 52. As shown in FIG. 8, in some embodiments, the surface plasma treatment region 60 may be disposed only at a part of the top surface 40S of the nitride layer 40 located between the first moat M1 and the source electrode 51. Additionally, in the embodiments of FIG. 7 and FIG. 8 described above, the fluorinated region 70 may not be included according to some considerations.

Figure 9:
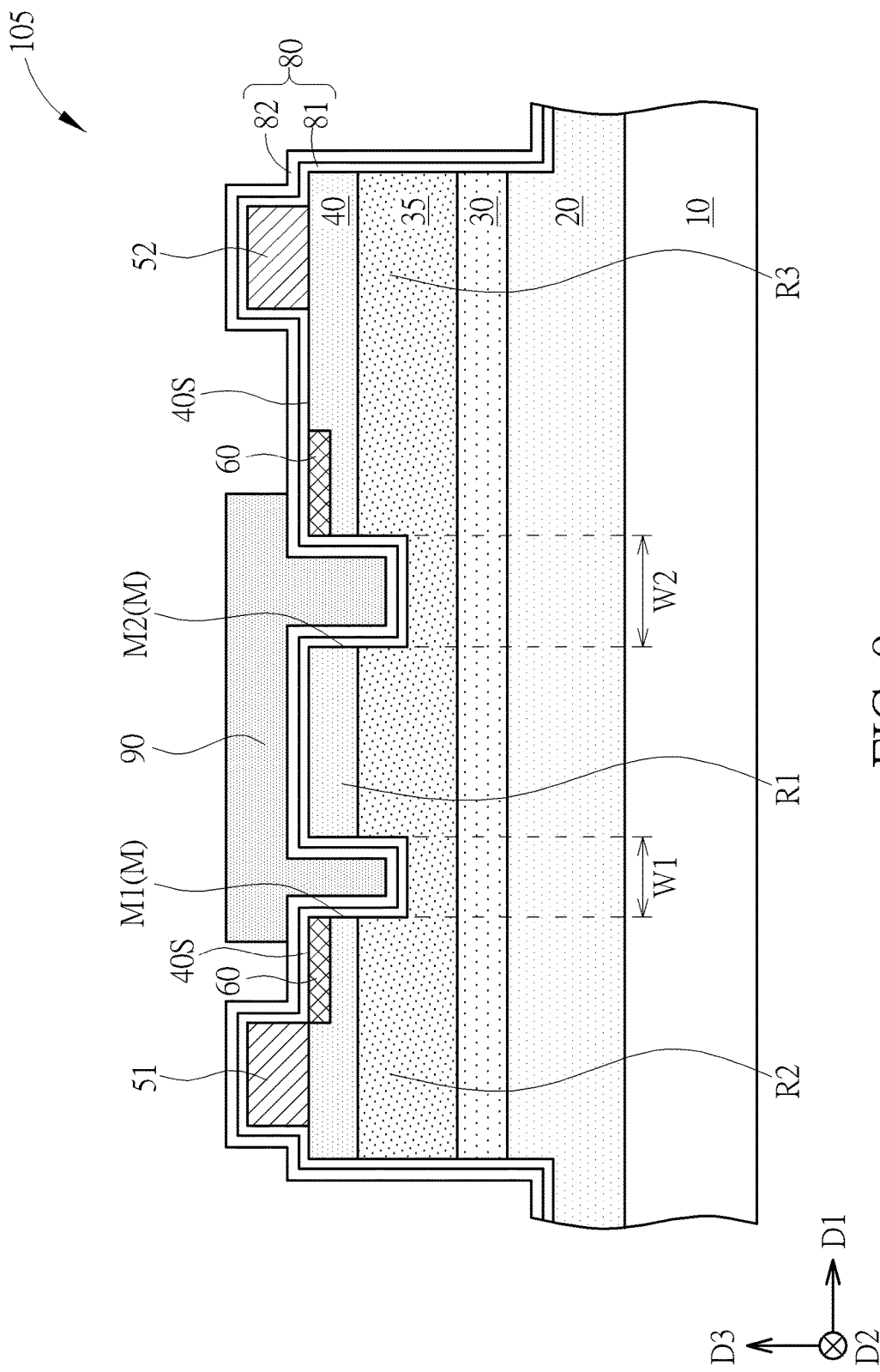
FIG. 9 is a schematic drawing illustrating an HEMT according to a fifth embodiment of the present invention.

Please refer to FIG. 9. FIG. 9 is a schematic drawing illustrating an HEMT according to a fifth embodiment of the present invention. As shown in FIG. 9, the difference between an HEMT 105 in this embodiment and the HEMT in the first embodiment mentioned above is that the HEMT 105 in this embodiment may further include a barrier layer 35 disposed between the nitride layer 40 and the III-V compound layer 30. The material of the barrier layer 35 may include aluminum gallium nitride, aluminum indium nitride, aluminum nitride, or other suitable III-V compounds. Additionally, in some embodiments, the first moat M1 and the second moat M2 may penetrate the nitride layer 40 for being partially disposed in the barrier layer 35 respectively. The surface plasma treatment region 60 may be at least partially disposed at the bottom surface of the moat M and/or the side surface of the moat M, and the surface plasma treatment region 60 may be at least partially disposed in the barrier layer 35, but not limited thereto. It is worth noting that the nitride layer 40 may be regarded as a capping layer when the barrier layer 35 is disposed between the nitride layer 40 and the III-V compound layer 30, and this stacked structure may also be applied to other embodiments of the present invention. Additionally in the stacked structure composed of the III-V compound layer 30, the barrier layer 35, and the nitride layer 40, the band gap of the nitride layer 40 may be narrower than the band gap of the barrier layer 35. For instance, the nitride layer 40 may be formed by gallium nitride or a material having aluminum ratio lower than that in the barrier layer 35, such as aluminum gallium nitride or aluminum indium nitride, and the barrier layer 35 may be formed by a higher-polarized material, such as aluminum indium nitride and aluminum nitride. When an N-polar gallium nitride based epitaxial substrate is used, the surface channel may be generated at the surface of the nitride layer 40 because of an energy band potential dip formed by the positively polarized charge at the surface. In addition, the surface channel may also be generated by the positively polarized charge at the surface of the nitride layer 40 when a high compressive strained dielectric capping layer and/or a high compressive strained passivation layer is formed on a Ga-polar gallium nitride based epitaxial substrate. Accordingly, the trap state at the surface of the nitride layer 40 may be altered and the energy band distribution may be modified by the formation of the surface plasma treatment region 50 at the surface of the nitride layer 40, the surface channel on the nitride layer 40 may be avoided accordingly, and the electrical performance and the reliability of the HEMT may be improved.

Figure 10:
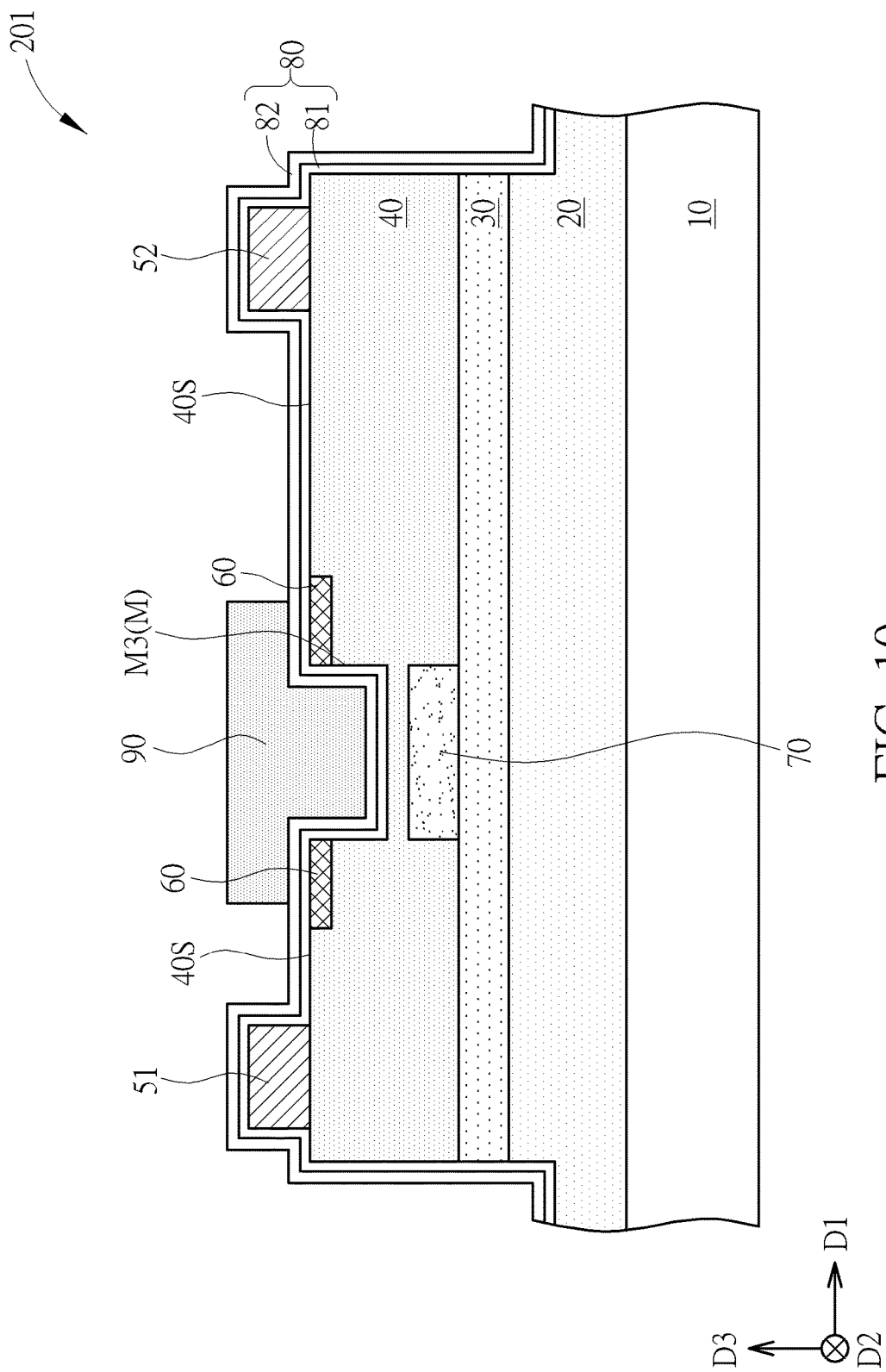
FIG. 10 is a schematic drawing illustrating an HEMT according to a sixth embodiment of the present invention.

Please refer to FIG. 10. FIG. 10 is a schematic drawing illustrating an HEMT according to a sixth embodiment of the present invention. As shown in FIG. 10, in an HEMT 201 of this embodiment, the moat M may include a gate moat M3, and the gate electrode 90 may be at least partially disposed in the gate moat M3. In addition, a part of the surface plasma treatment region 60 may be disposed in the nitride layer 40 located between the gate moat M3 and the source electrode 51, and another part of the surface plasma treatment region 60 may be disposed in the nitride layer 40 located between the gate moat M3 and the drain electrode 52. In other words, the surface plasma treatment region 60 may be disposed at the top surface 40S of the nitride layer 40 located at two opposite sides of the gate moat M3 in the first direction D1. Additionally, the fluorinated region 70 may be at least partially disposed corresponding to the gate moat M3, and at least a part of the fluorinated region 70 may be disposed under the gate moat M3 in the vertical direction D3, but not limited thereto.

Figure 11:
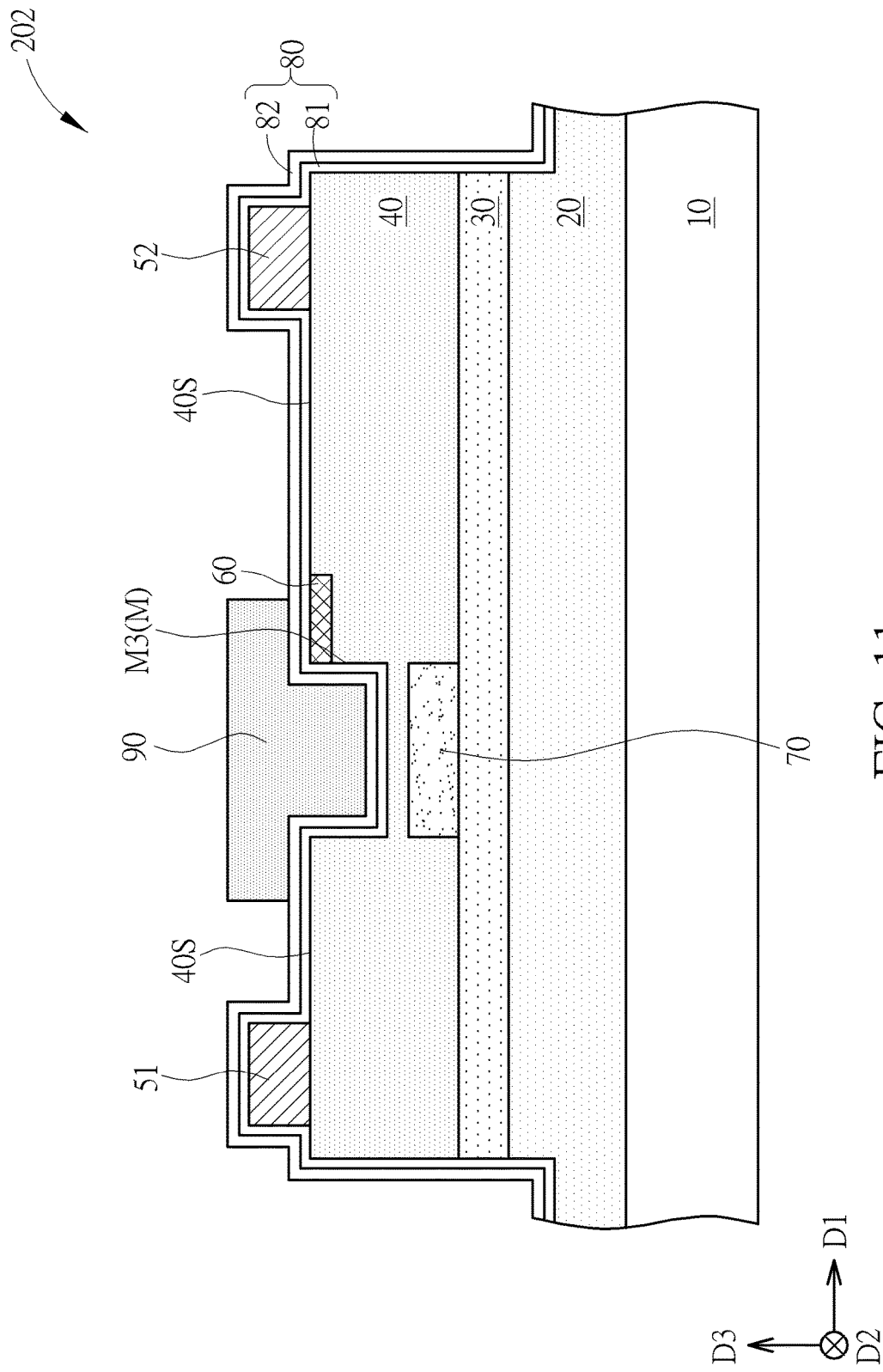
FIG. 11 is a schematic drawing illustrating an HEMT according to a seventh embodiment of the present invention.
Figure 12:
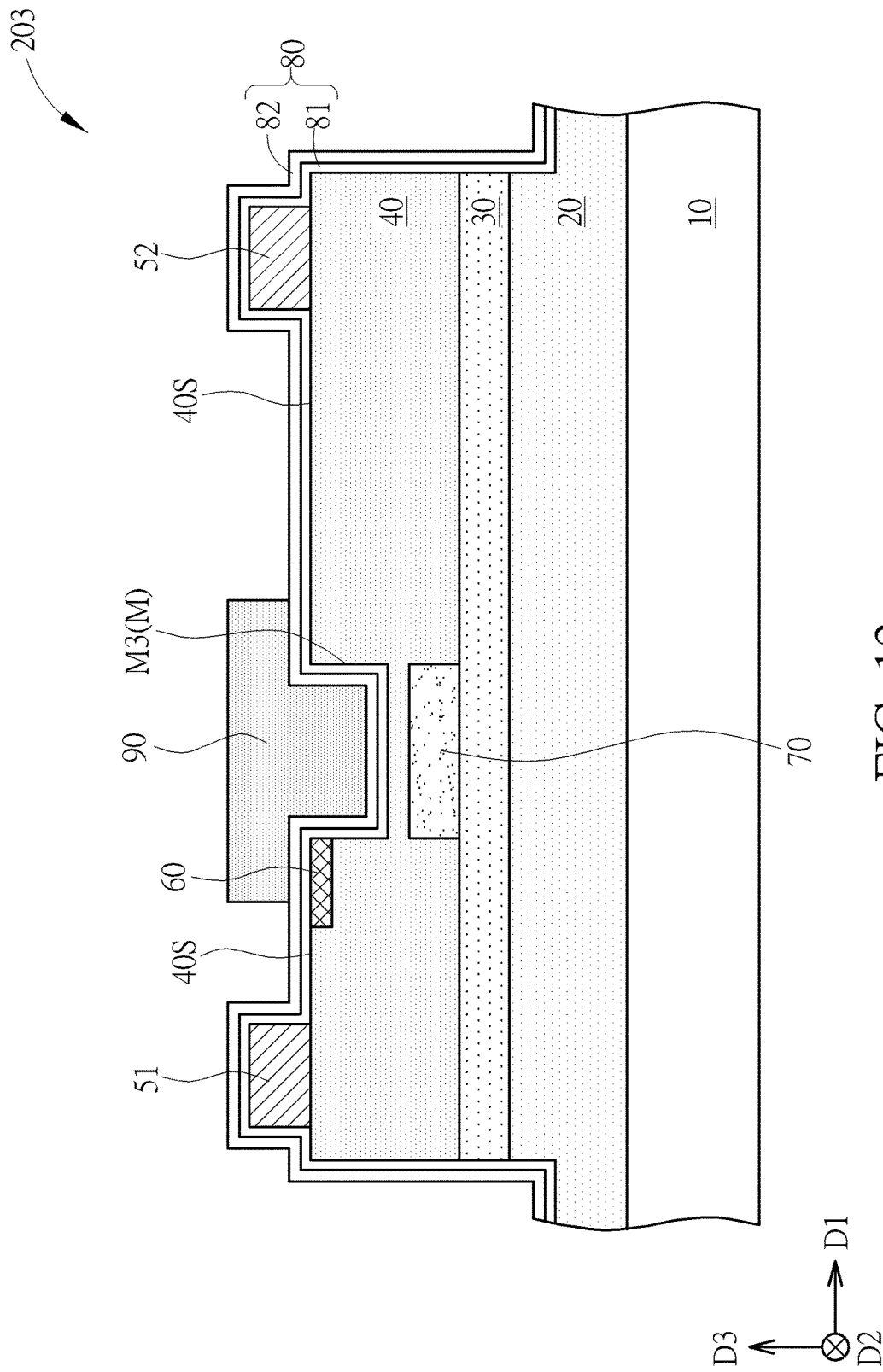
FIG. 12 is a schematic drawing illustrating an HEMT according to an eighth embodiment of the present invention.
Figure 13:
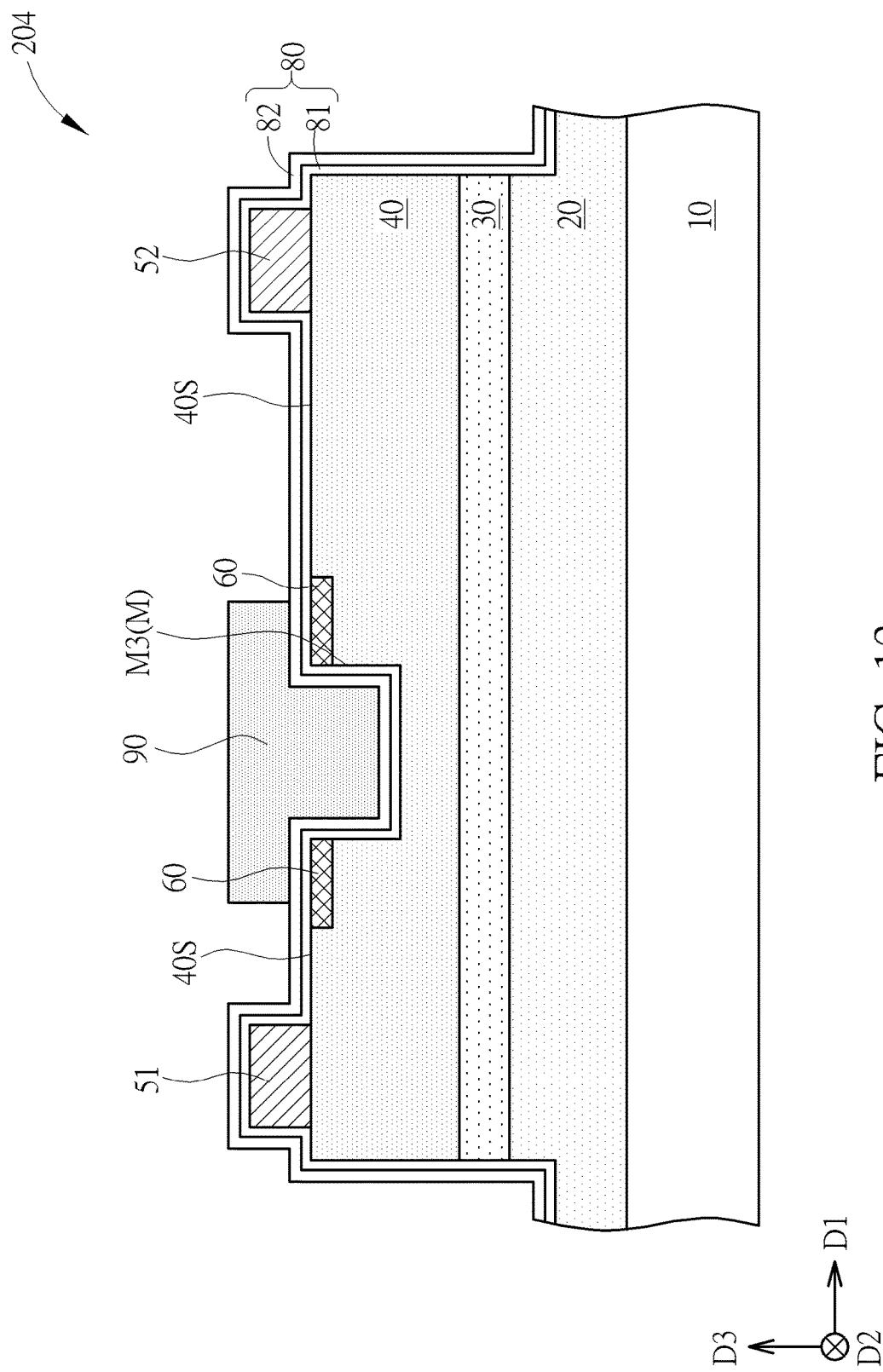
FIG. 13 is a schematic drawing illustrating an HEMT according to a ninth embodiment of the present invention.

Please refer to FIGS. 11-13. FIG. 11 is a schematic drawing illustrating an HEMT 202 according to a seventh embodiment of the present invention, FIG. 12 is a schematic drawing illustrating an HEMT 203 according to an eighth embodiment of the present invention, and FIG. 13 is a schematic drawing illustrating an HEMT 204 according to a ninth embodiment of the present invention. In the HEMT of the present invention, the demanded effects of suppressing the current collapse and improving the hysteresis of the threshold voltage may be obtained by modifying the location of the surface plasma treatment region 60. For example, as shown in FIG. 11, in some embodiments, the surface plasma treatment region 60 may be disposed only at a part of the top surface 40S of the nitride layer 40 located between the gate moat M3 and the drain electrode 52. As shown in FIG. 12, in some embodiments, the surface plasma treatment region 60 may be disposed only at a part of the top surface 40S of the nitride layer 40 located between the gate moat M3 and the source electrode 51. Additionally, as shown in FIG. 13, the fluorinated region 70 in the sixth embodiment described above may not be included in some embodiments, and the surface plasma treatment region 60 may be formed only at a part of the top surface 40S of the nitride layer 40 located at the two opposite sides of the gate moat M3. In the embodiments of FIG. 11 and FIG. 12 described above, the fluorinated region 70 may not be included according to some considerations.

Figure 14:
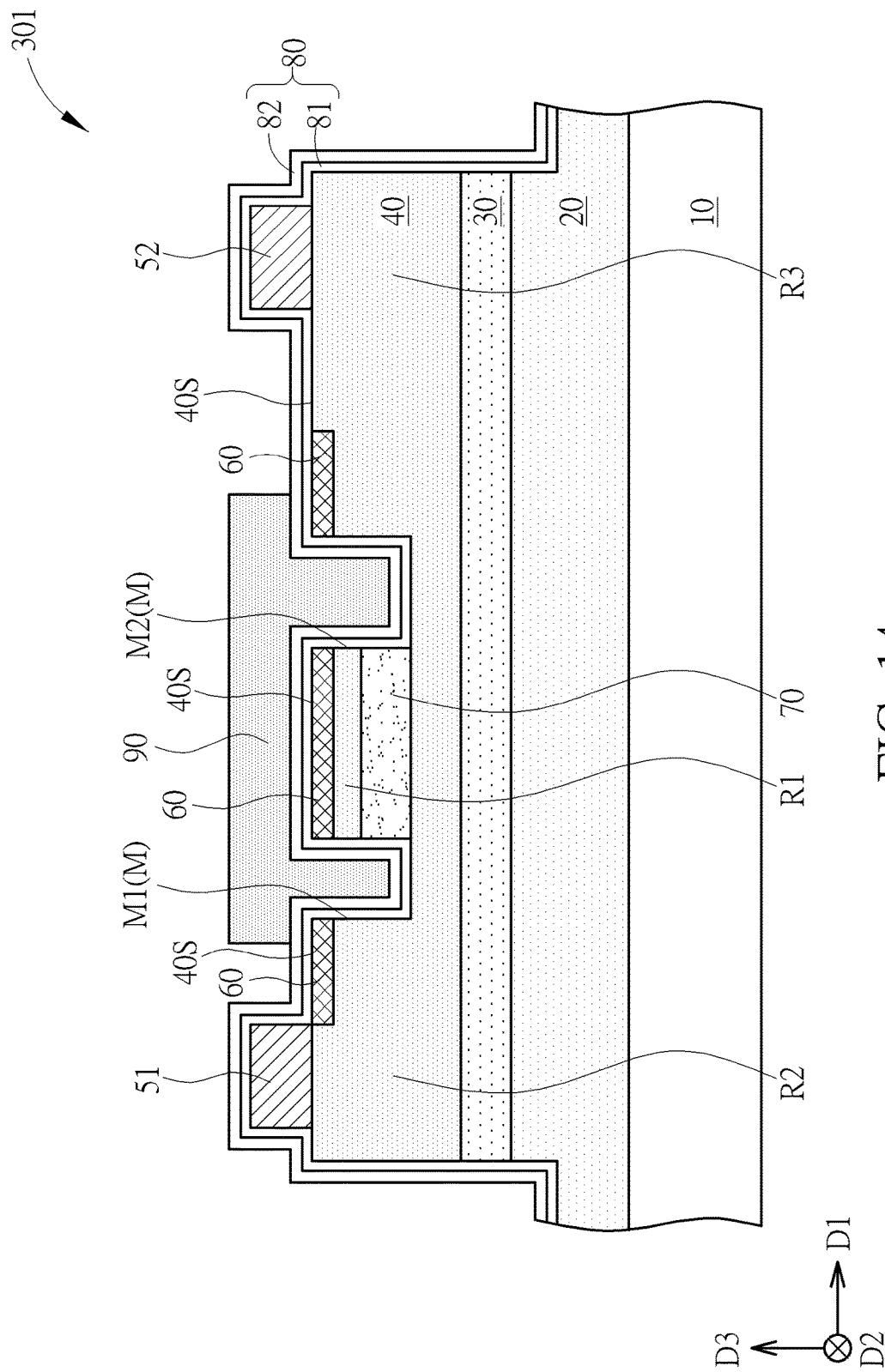
FIG. 14 is a schematic drawing illustrating an HEMT according to a tenth embodiment of the present invention.

Please refer to FIG. 14. FIG. 14 is a schematic drawing illustrating an HEMT according to a tenth embodiment of the present invention. As shown in FIG. 14, the difference between an HEMT 301 in this embodiment and the HEMT in the second embodiment mentioned above is that the surface plasma treatment region 60 in the HEMT 301 may be partly disposed above the fluorinated region 70, and the surface plasma treatment region 60 may be partly disposed in the nitride layer 40 located between the first moat M1 and the second moat M2. In other words, the surface plasma treatment region 60 may be further disposed at the top surface 40S of the nitride layer 40 located between the first moat M1 and the second moat M2, and the surface plasma treatment region 60 disposed above the fluorinated region 70 may be separated from the fluorinated region 70, but not limited thereto. In some embodiments, the surface plasma treatment region 60 disposed above the fluorinated region 70 may be directly connected with the fluorinated region 70 according to some considerations.

Figure 15:
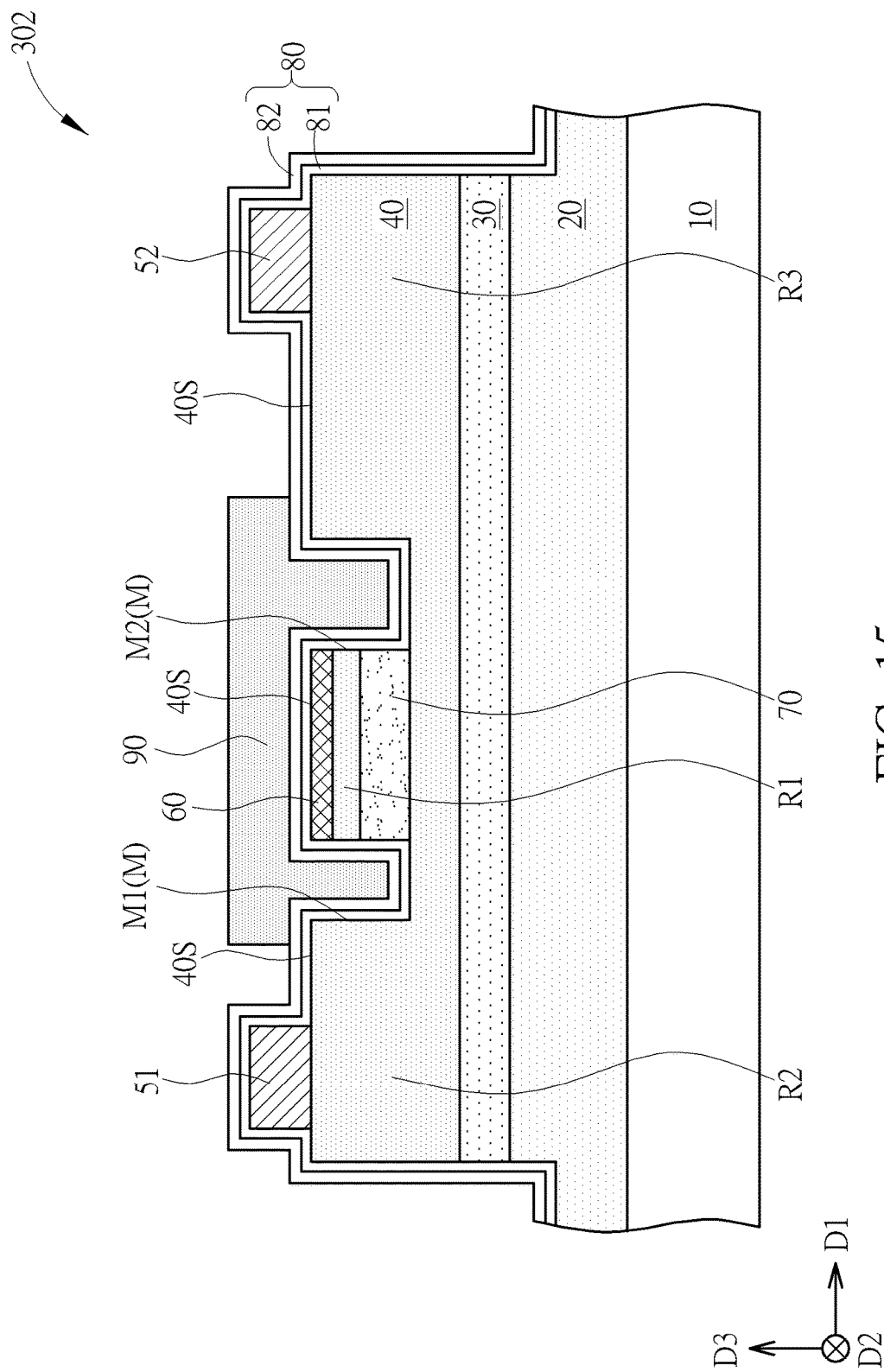
FIG. 15 is a schematic drawing illustrating an HEMT according to an eleventh embodiment of the present invention.
Figure 16:
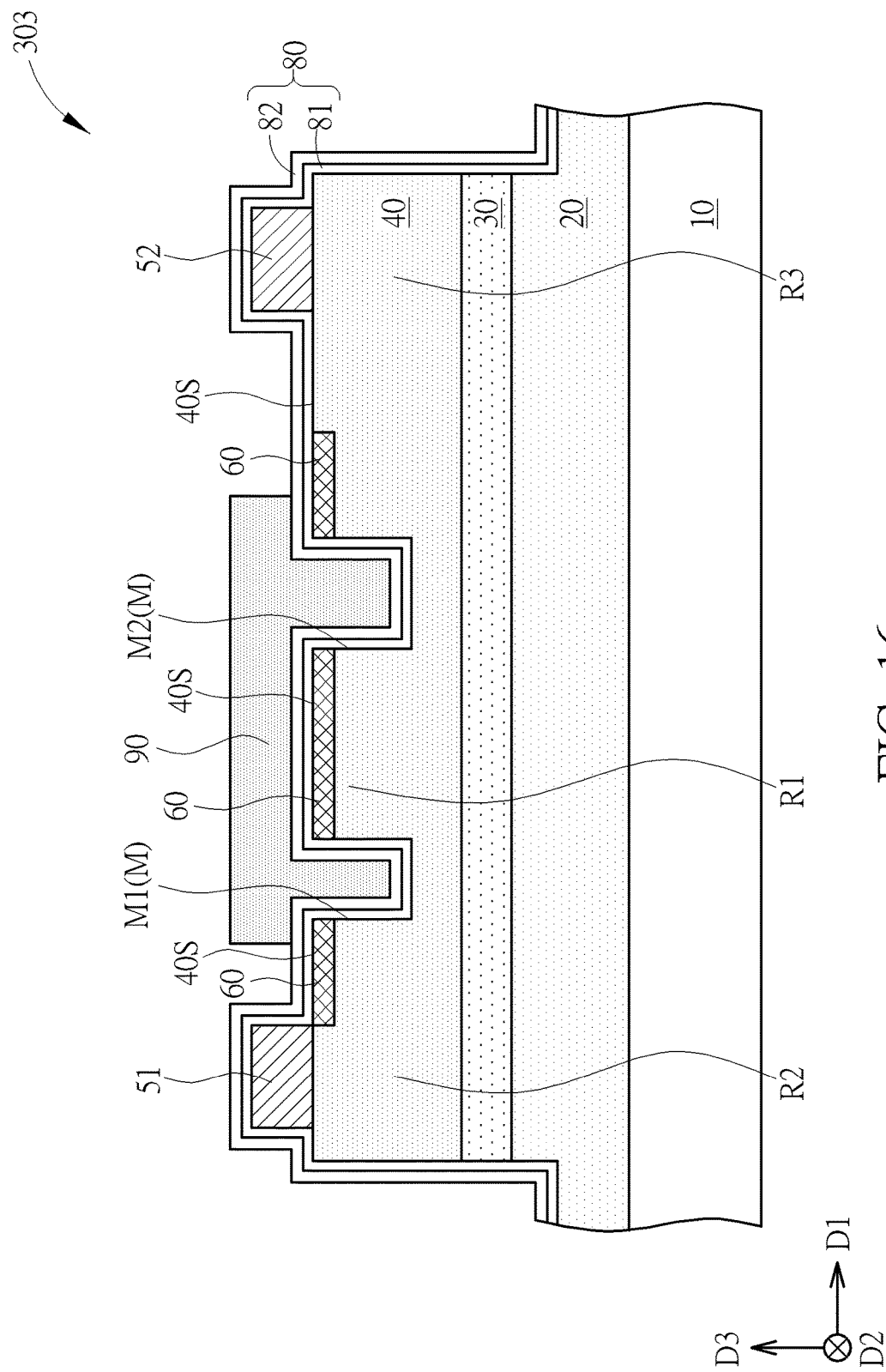
FIG. 16 is a schematic drawing illustrating an HEMT according to a twelfth embodiment of the present invention.
Figure 17:
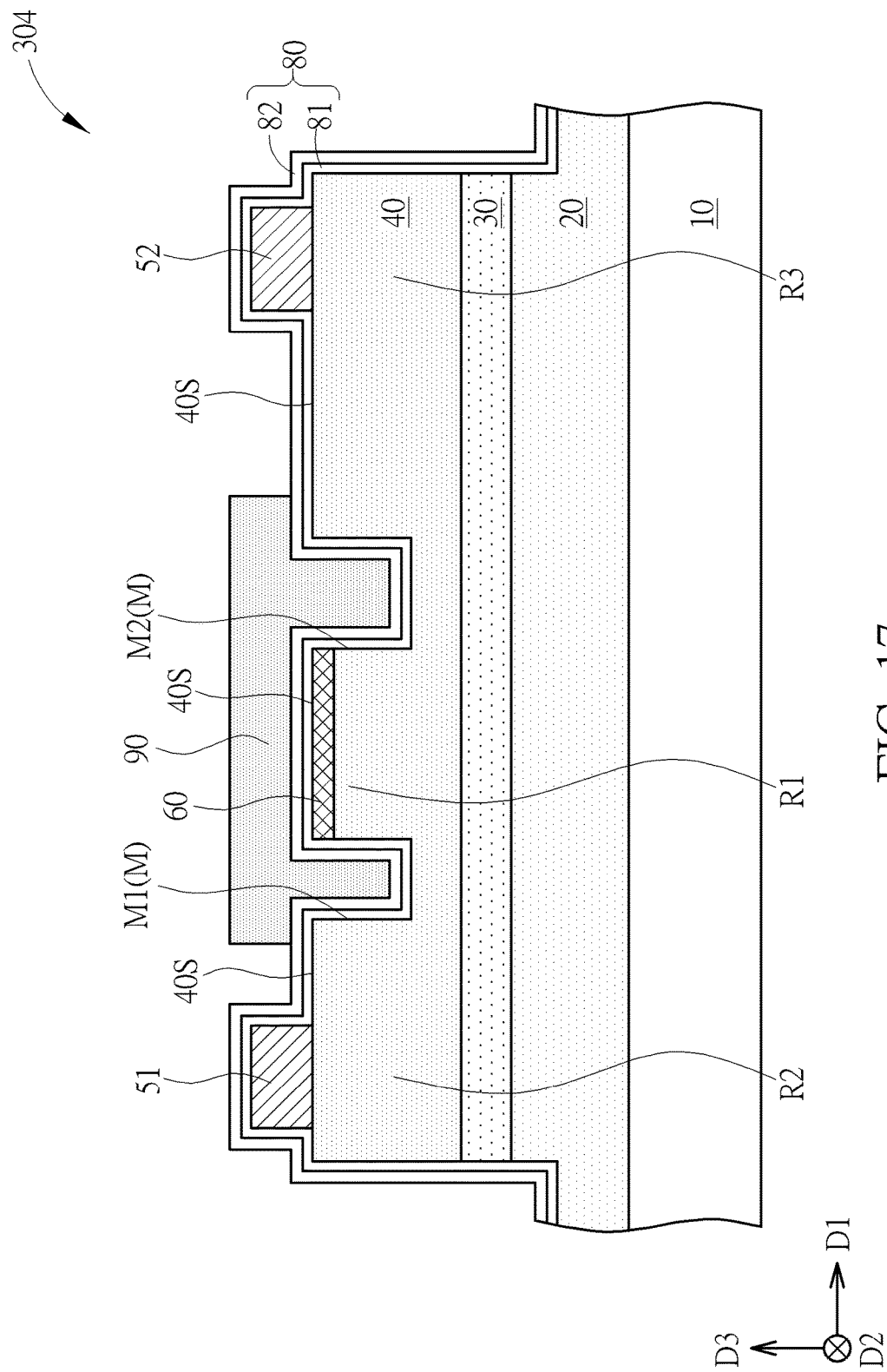
FIG. 17 is a schematic drawing illustrating an HEMT according to a thirteenth embodiment of the present invention.

Please refer to FIGS. 15-17. FIG. 15 is a schematic drawing illustrating an HEMT 302 according to an eleventh embodiment of the present invention, FIG. 16 is a schematic drawing illustrating an HEMT 303 according to a twelfth embodiment of the present invention, and FIG. 17 is a schematic drawing illustrating an HEMT 304 according to a thirteenth embodiment of the present invention. In the HEMT of the present invention, the demanded effects of suppressing the current collapse and improving the hysteresis of the threshold voltage may be obtained by modifying the location of the surface plasma treatment region 60. For example, as shown in FIG. 15, in some embodiments, the surface plasma treatment region 60 may be disposed only at the top surface 40S of the nitride layer 40 located between the first moat M1 and the second moat M2. As shown in FIG. 16 and FIG. 17, the fluorinated region 70 in the tenth embodiment described above may not be included in some embodiments, and the surface plasma treatment region 60 may be disposed only at the top surface 40S of the nitride layer 40 located between the first moat M1 and the second moat M2. Additionally, in some embodiments, the surface plasma treatment region 60 may be disposed only at the top surface 40S of the nitride layer 40 located between the first moat M1 and the second moat M2 and at the top surface 40S of the nitride layer 40 located between the second moat M2 and the drain electrode 52, or the surface plasma treatment region 60 may be disposed only at the top surface 40S of the nitride layer 40 located between the first moat M1 and the second moat M2 and at the top surface 40S of the nitride layer 40 located between the first moat M1 and the source electrode 51.

Figure 18:
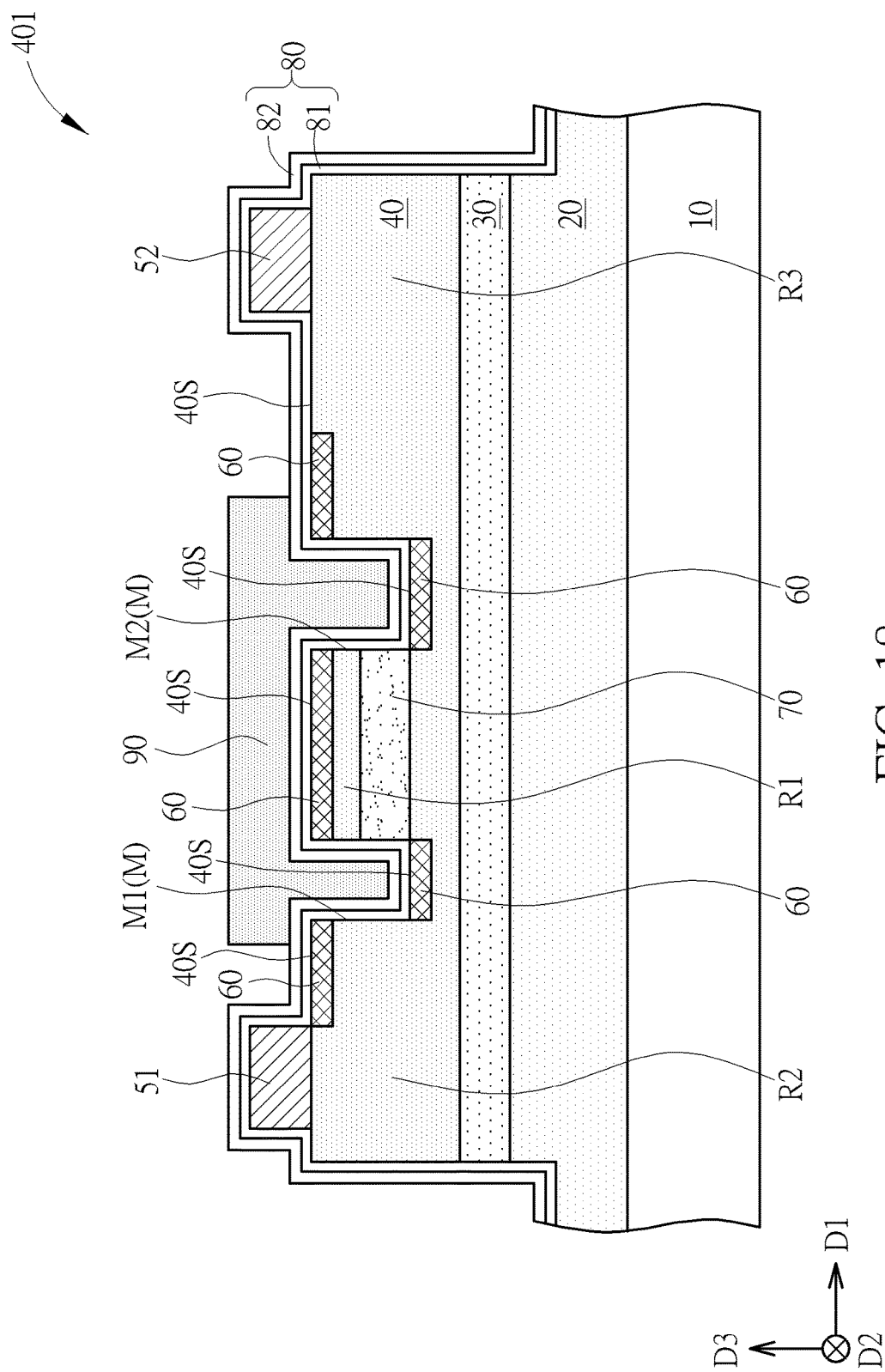
FIG. 18 is a schematic drawing illustrating an HEMT according to a fourteenth embodiment of the present invention.

Please refer to FIG. 18. FIG. 18 is a schematic drawing illustrating an HEMT according to a fourteenth embodiment of the present invention. As shown in FIG. 18, the difference between an HEMT 401 in this embodiment and the HEMT in the tenth embodiment mentioned above is that the surface plasma treatment region 60 in the HEMT 401 may be partially disposed in the nitride layer 40 under the first moat M1 and partially disposed in the nitride layer 40 under the second moat M2. In other words, the surface plasma treatment region 60 may be further disposed at the top surface 40S of the nitride layer 40 located under the first moat M1 and the top surface 40S of the nitride layer 40 located under the second moat M2, or a part of the surface plasma treatment region 60 may be disposed at the bottom surface of the first moat M1 and the bottom surface of the second moat M2. Problems such as surface leakage current and/or current collapse may be generated because of etching damage formed by the etching process of forming the first moat M1 and the second moat M2 at the bottom surface of the first moat M1 and the bottom surface of the second moat M2, and the surface plasma treatment region 60 formed at the bottom surface of the first moat M1 and the bottom surface of the second moat M2 may be used to passivate the bottom surface of the first moat M1 and the bottom surface of the second moat M2 for improving the etching damage induced problems such as surface leakage current and/or current collapse. Additionally, in some embodiments, the surface plasma treatment region 60 may be not disposed at the top surface 40S of the nitride layer 40 located between the second moat M2 and the drain electrode 52 or at the top surface 40S of the nitride layer 40 located between the first moat M1 and the source electrode 51, but not limited thereto.

Figure 19:
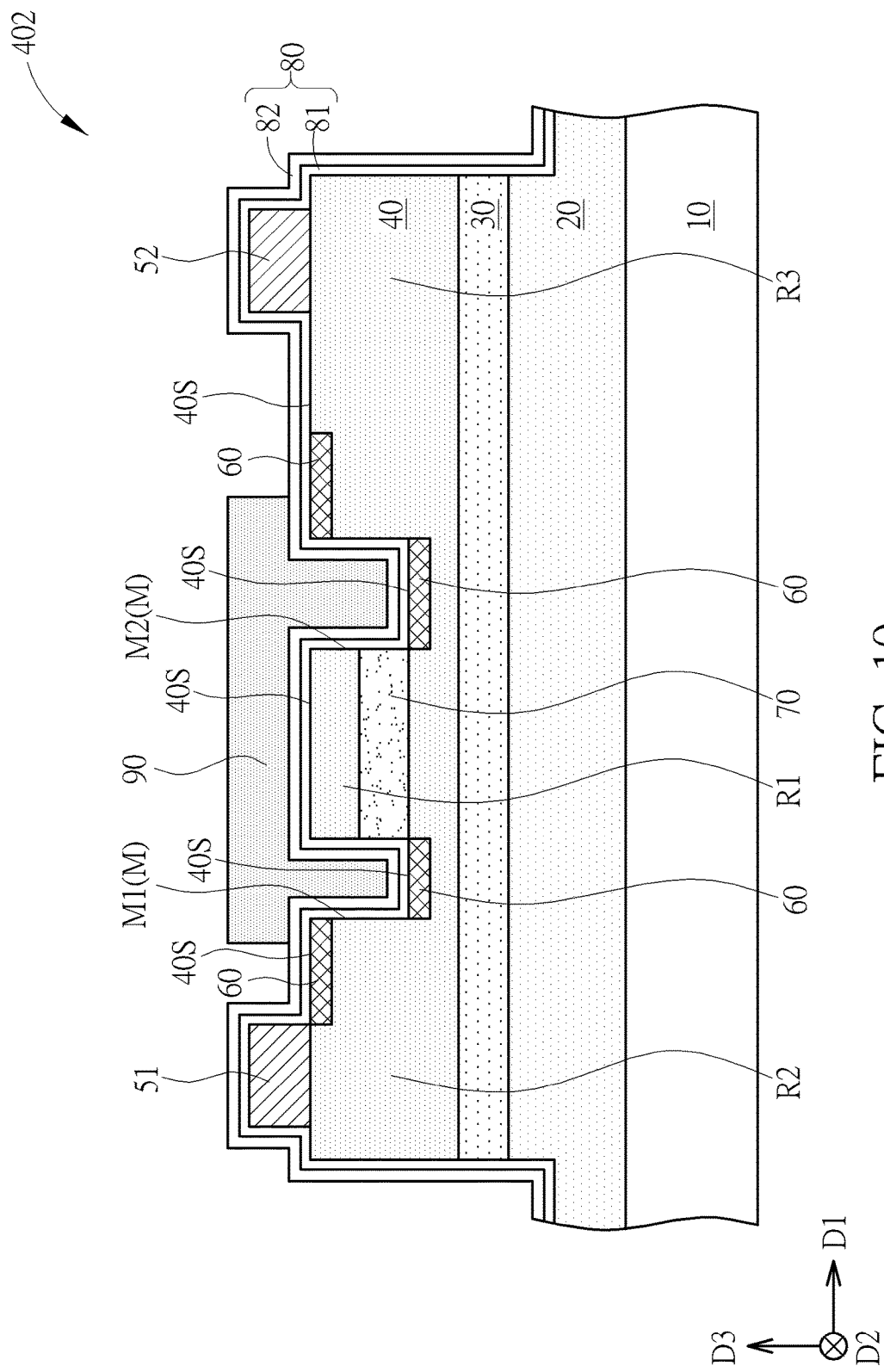
FIG. 19 is a schematic drawing illustrating an HEMT according to a fifteenth embodiment of the present invention.
Figure 20:
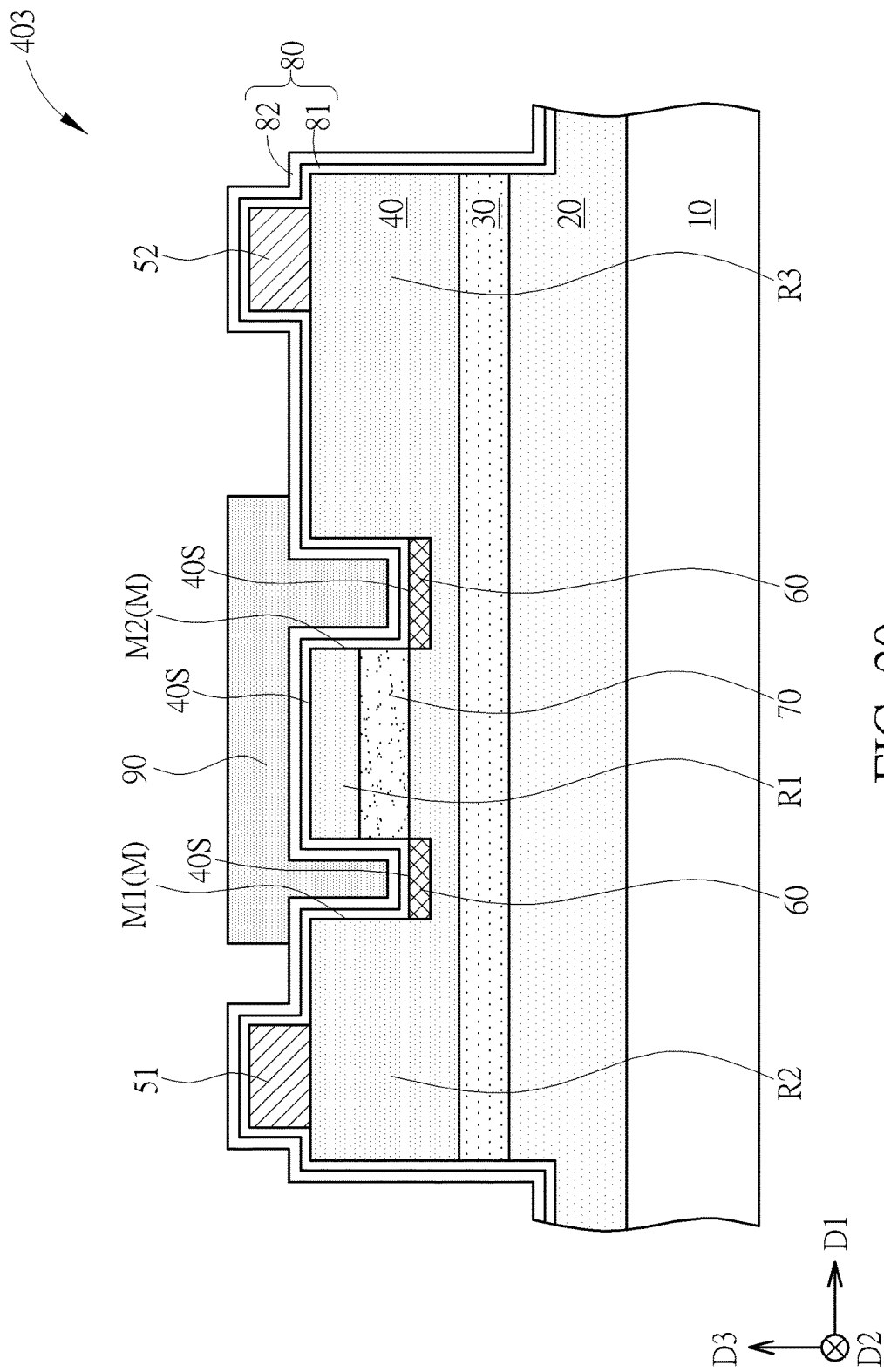
FIG. 20 is a schematic drawing illustrating an HEMT according to a sixteenth embodiment of the present invention.
Figure 21:
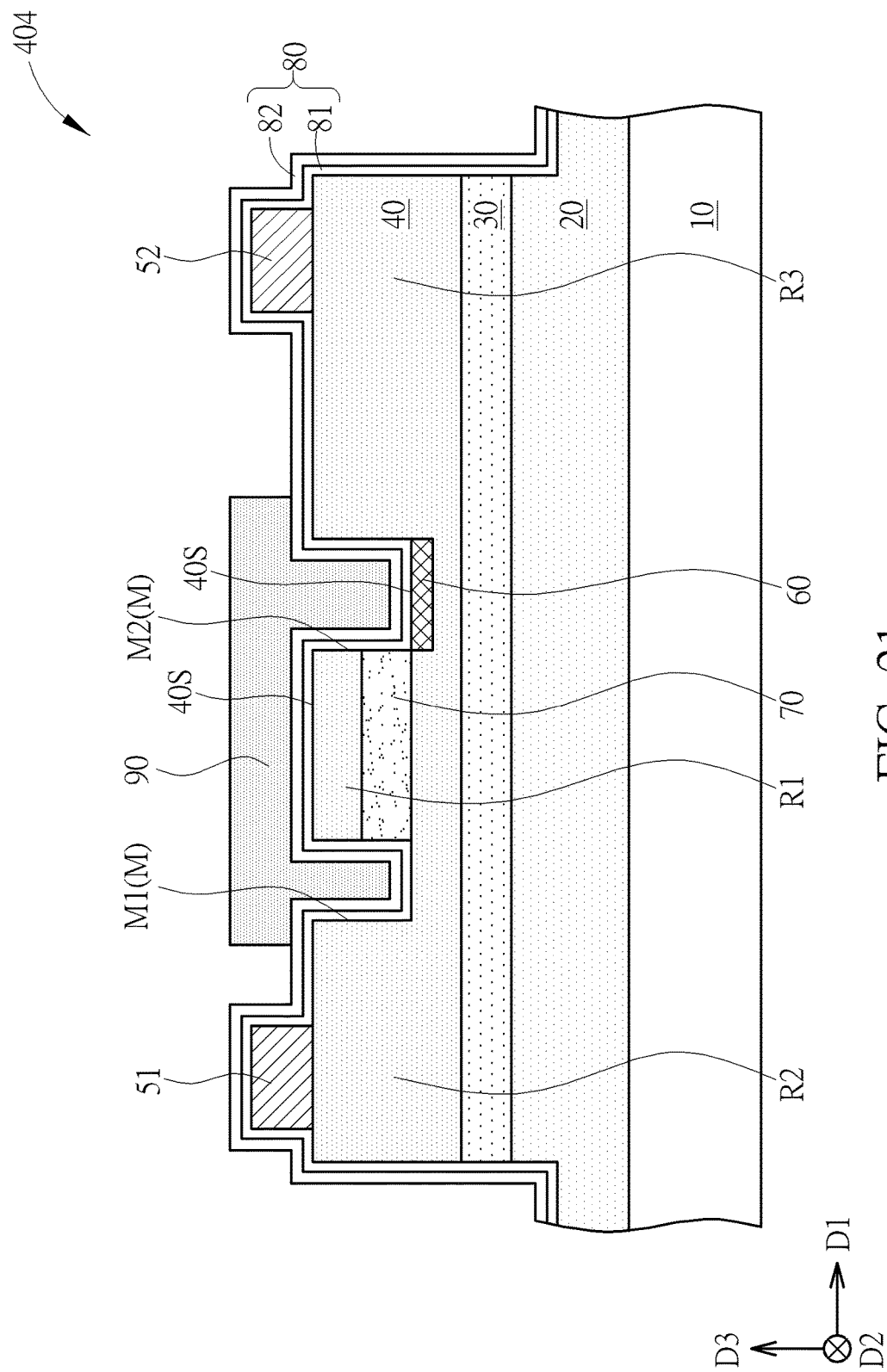
FIG. 21 is a schematic drawing illustrating an HEMT according to a seventeenth embodiment of the present invention.
Figure 22:
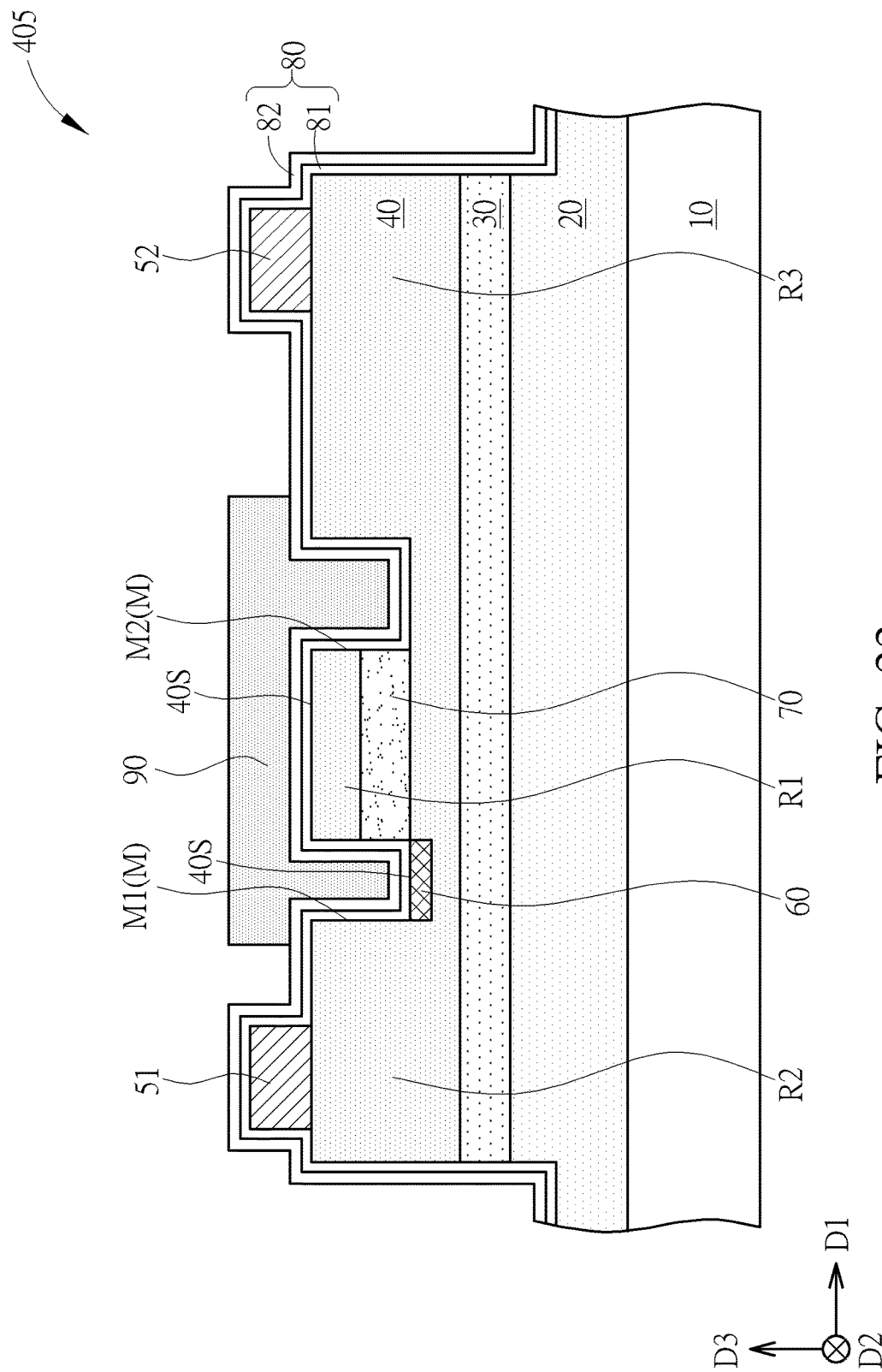
FIG. 22 is a schematic drawing illustrating an HEMT according to an eighteenth embodiment of the present invention.

Please refer to FIGS. 19-22. FIG. 19 is a schematic drawing illustrating an HEMT 402 according to a fifteenth embodiment of the present invention, FIG. 20 is a schematic drawing illustrating an HEMT 403 according to a sixteenth embodiment of the present invention, FIG. 21 is a schematic drawing illustrating an HEMT 404 according to a seventeenth embodiment of the present invention, and FIG. 22 is a schematic drawing illustrating an HEMT 405 according to an eighteenth embodiment of the present invention. In the HEMT of the present invention, the position of forming the surface plasma treatment region 60 may be modified for generating the demanded effects of suppressing current collapse and improving the surface current leakage. For example, as shown in FIG. 19, compared with the fourteenth embodiment described above, the surface plasma treatment region 60 may be not disposed in the nitride layer 40 located between the first moat M1 and the second moat M2 in some embodiments. As shown in FIG. 20, in some embodiments, the surface plasma treatment region 60 may be disposed only at the top surface 40S of the nitride layer 40 under the first moat M1 and the second moat M2. Additionally, as shown in FIG. 21 and FIG. 22, in some embodiments, the surface plasma treatment region 60 may be disposed only at the top surface 40S of the nitride layer 40 under the first moat M1 or be disposed only at the top surface 40S of the nitride layer 40 under the second moat M2. In some embodiments, the surface plasma treatment region 60 may be disposed only at the top surface 40S of the nitride layer 40 under the first moat M1 and the second moat M2 and at the top surface 40S of the nitride layer 40 located between the second moat M2 and the drain electrode 52, or the surface plasma treatment region 60 may be disposed only at the top surface 40S of the nitride layer 40 under the first moat M1 and the second moat M1 and at the top surface 40S of the nitride layer 40 located between the first moat M1 and the source electrode 51

Figure 23:
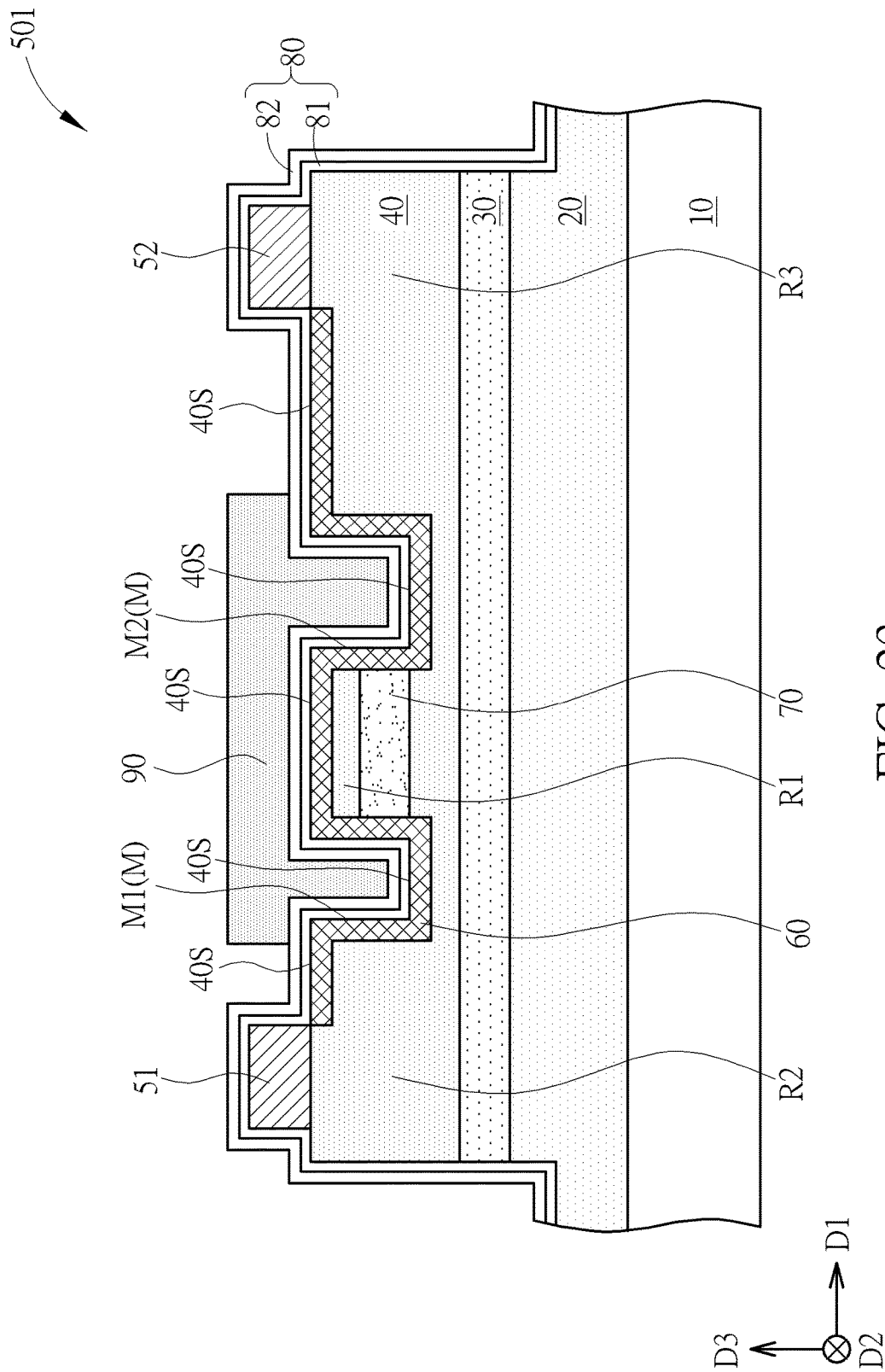
FIG. 23 is a schematic drawing illustrating an HEMT according to a nineteenth embodiment of the present invention.
Figure 24:
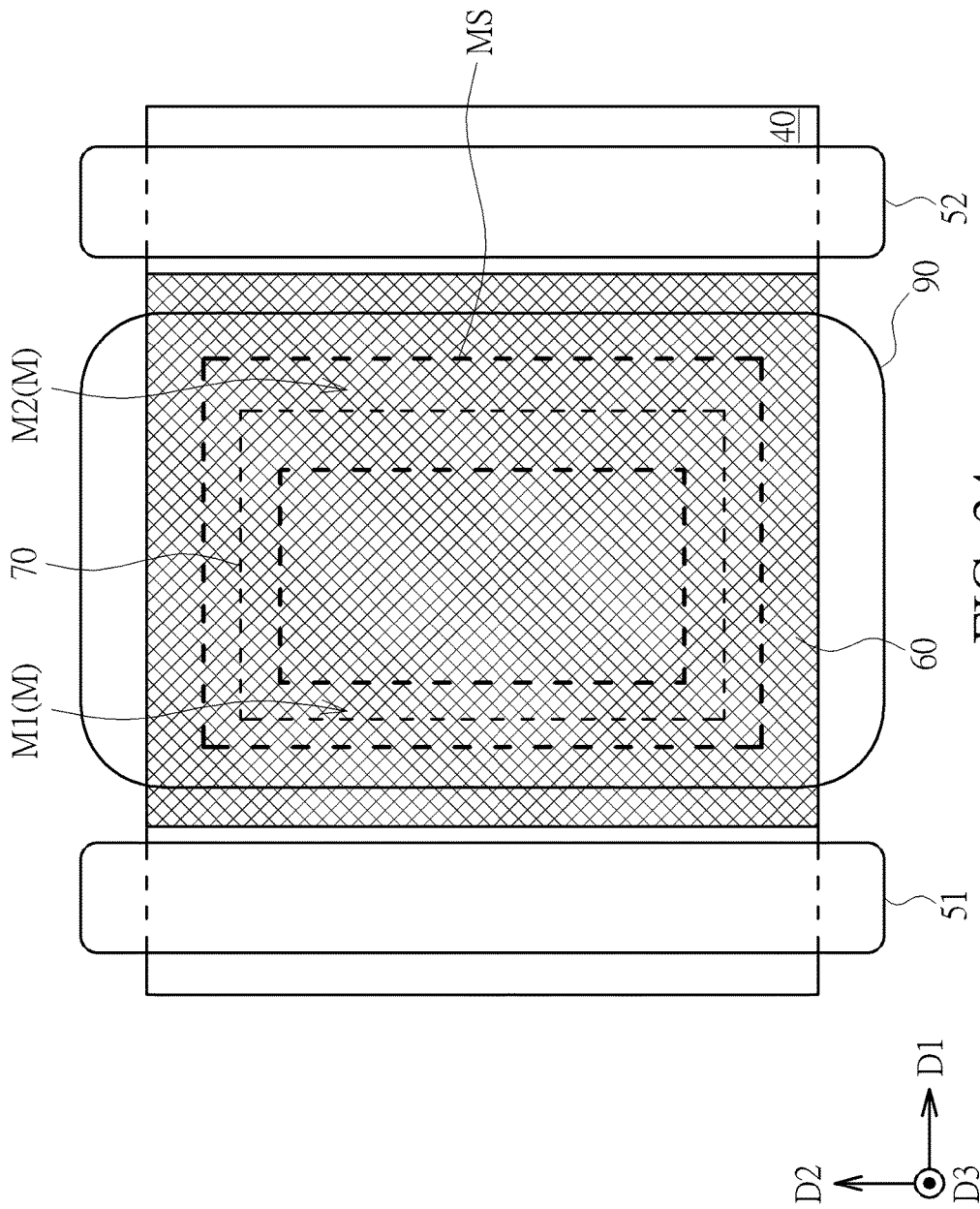
FIG. 24 is a top view schematic drawing illustrating the HEMT according to the nineteenth embodiment of the present invention.

Please refer to FIG. 23 and FIG. 24. FIG. 23 is a schematic drawing illustrating an HEMT according to a nineteenth embodiment of the present invention, and FIG. 24 is a top view schematic drawing illustrating the HEMT in this embodiment. As shown in FIG. 23 and FIG. 24, the difference between an HEMT 501 in this embodiment and the HEMT in the fourteenth embodiment mentioned above is that a part of the surface plasma treatment region 60 in the HEMT 501 may be further disposed at a sidewall of the first moat M1 and a sidewall of the second moat M2. In other words, the surface plasma treatment region 60 may be disposed at the top surface 40S of the nitride layer 40 located between the source electrode 51 and the drain electrode 52, the bottom surfaces of the first moat M1 and the second moat M2, and the sidewalls of the first moat M1 and the second moat M2. Problems such as leakage current and/or current collapse may be generated because of etching damage formed by the etching process of forming the first moat M1 and the second moat M2 at the sidewall of the first moat M1 and the sidewall of the second moat M2, and the surface plasma treatment region 60 formed at the sidewall of the first moat M1 and the sidewall of the second moat M2 may be used to generate a passivation effect for improving the etching damage induced problems such as leakage current and/or current collapse.

Figure 25:
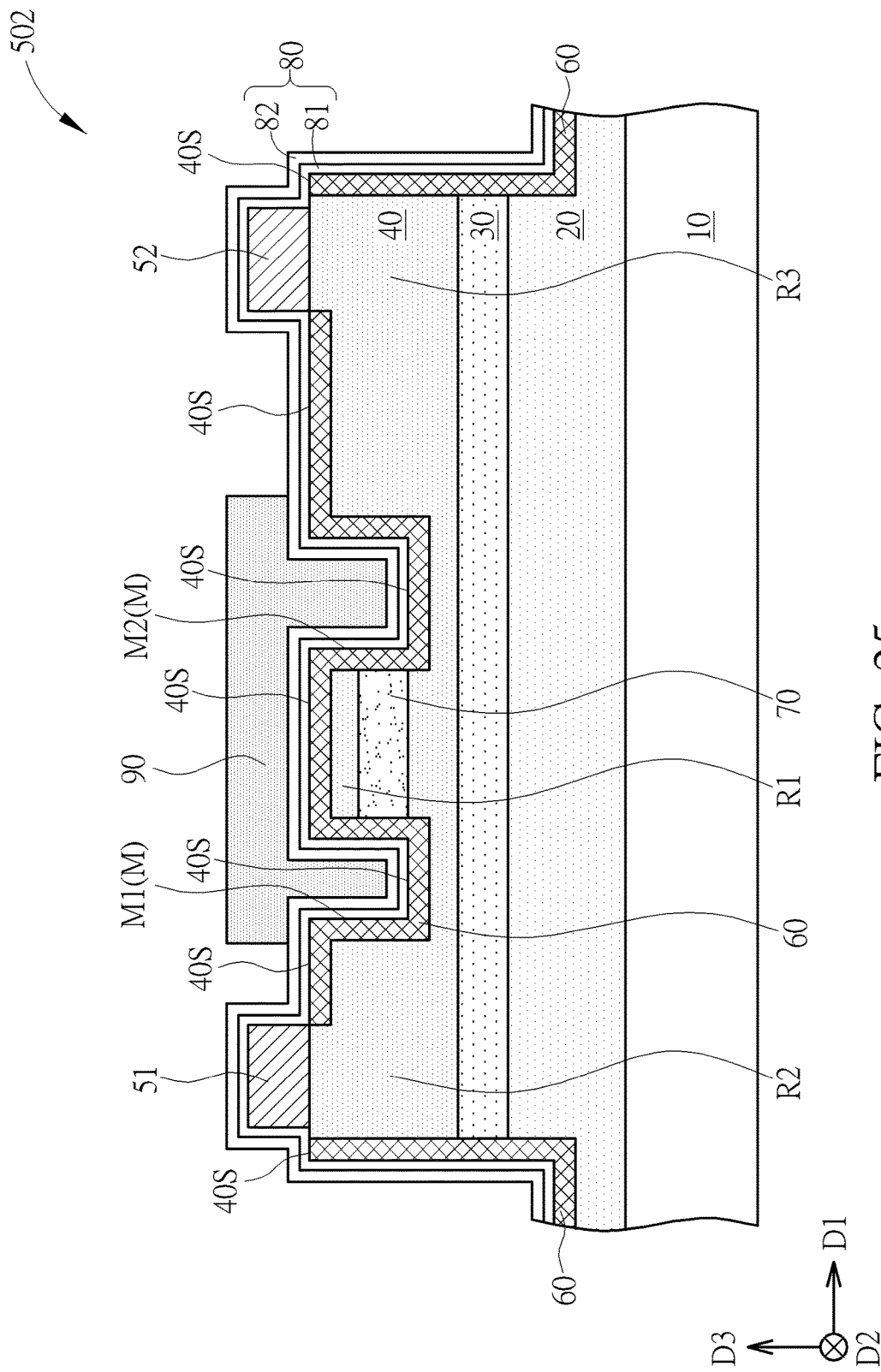
FIG. 25 is a schematic drawing illustrating an HEMT according to a twentieth embodiment of the present invention.
Figure 26:
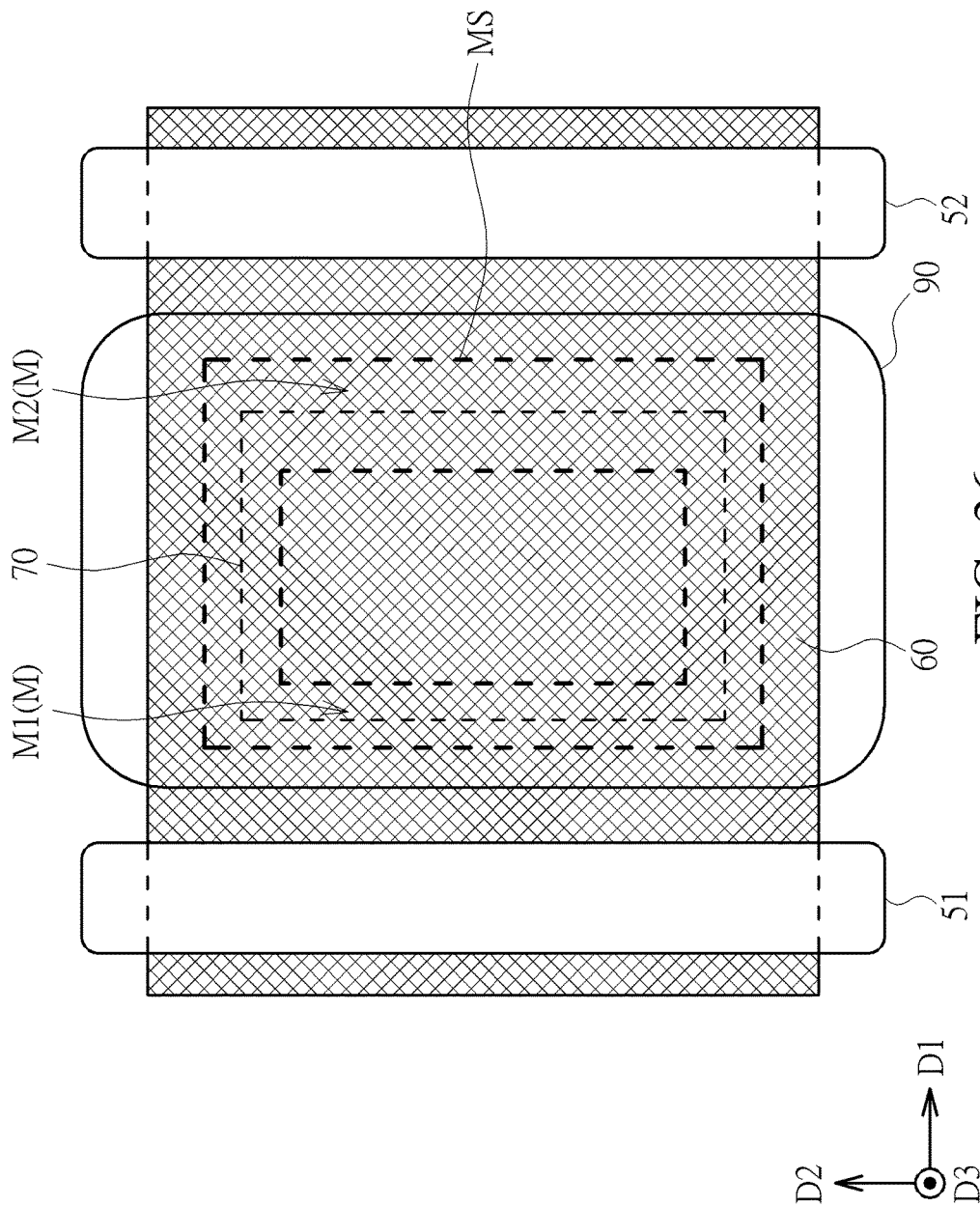
FIG. 26 is a top view schematic drawing illustrating the HEMT according to the twentieth embodiment of the present invention.

Please refer to FIG. 25 and FIG. 26. FIG. 25 is a schematic drawing illustrating an HEMT according to a twentieth embodiment of the present invention, and FIG. 26 is a top view schematic drawing illustrating the HEMT in this embodiment. As shown in FIG. 25 and FIG. 26, the difference between an HEMT 502 in this embodiment and the HEMT in the nineteenth embodiment mentioned above is that a part of the surface plasma treatment region 60 in the HEMT 502 may be further disposed at two opposite side surfaces of the nitride layer 40 in the first direction D1, two opposite side surfaces of the III-V compound layer 30 in the first direction D1, a side surface of the buffer layer 20, and a part of the top surface of the buffer layer 20 for forming passivation effect at the regions mentioned above. Problems such as leakage current and/or current collapse, which may be generated because of etching damage formed by etching the nitride layer 40, the III-V compound layer 30, and the buffer layer 20 for forming the mesa structure, may be avoided accordingly.

To summarize the above descriptions, in the HEMT of the present invention, the surface channel formed at the top surface of the nitride layer may be suppressed and/or mitigated by forming the surface plasma treatment region at the top surface of the nitride layer, and problems such as hysteresis of the threshold voltage and current collapse may be improved. Additionally, the surface plasma treatment region formed at the bottom surface of the moat, the sidewall of the moat, and/or other areas may also be used to suppress the problems generated by the etching damage formed by the related manufacturing processes, such as leakage current. The electrical performance and the reliability of the HEMT may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a III-V compound layer;
   a nitride layer disposed on the III-V compound layer;
   a source electrode and a drain electrode disposed above the III-V compound layer;
   a gate electrode disposed over the nitride layer located between the source electrode and the drain electrode, wherein the nitride layer comprises a first region disposed under the gate electrode;
   at least one moat at least partially disposed in the nitride layer and at least partially disposed between the source electrode and the drain electrode, wherein the at least one moat comprises a first moat and a second moat, the first moat is at least partially disposed between the first region and the source electrode, and the second moat is at least partially disposed between the first region and the drain electrode;
   a fluorinated region disposed in the nitride layer, wherein at least a part of the fluorinated region is disposed in the first region of the nitride layer, and at least a part of the fluorinated region is disposed between the first moat and the second moat; and
   a surface plasma treatment region at least partially disposed in the nitride layer, wherein the surface plasma treatment region is at least partially disposed at a top surface of the nitride layer disposed between the at least one moat and the drain electrode, at a top surface of the nitride layer disposed between the at least one moat and the source electrode, and/or at a top surface of the nitride layer under the at least one moat.

2. The HEMT of claim 1, wherein the first moat and the second moat are separated from each other.

3. The HEMT of claim 1, wherein the first moat and the second moat are connected with each other.

4. The HEMT of claim 3, wherein a moat structure comprising the first moat and the second moat surrounds the first region of the nitride layer.

5. The HEMT of claim 1, wherein at least a part of the surface plasma treatment region is disposed in the nitride layer located between the first moat and the source electrode.

6. The HEMT of claim 1, wherein at least a part of the surface plasma treatment region is disposed in the nitride layer located between the second moat and the drain electrode.

7. The HEMT of claim 1, wherein at least a part of the surface plasma treatment region is disposed in the nitride layer located between the first moat and the second moat.

8. The HEMT of claim 1, wherein at least a part of the surface plasma treatment region is disposed in the nitride layer under the first moat.

9. The HEMT of claim 1, wherein at least a part of the surface plasma treatment region is disposed in the nitride layer under the second moat.

10. The HEMT of claim 1, wherein at least a part of the surface plasma treatment region is disposed at a sidewall of the first moat.

11. The HEMT of claim 1, wherein at least a part of the surface plasma treatment region is disposed at a sidewall of the second moat.

12. The HEMT of claim 1, wherein at least a part of the surface plasma treatment region is disposed above the fluorinated region in a thickness direction of the III-V compound layer.

13. The HEMT of claim 1, wherein the surface plasma treatment region comprises a fluorine plasma region, and a fluorine concentration of the surface plasma treatment region is lower than a fluorine concentration of the fluorinated region.

* * * * *